(12) United States Patent
Reitsma et al.

(10) Patent No.: US 10,036,656 B2
(45) Date of Patent: *Jul. 31, 2018

(54) POSITION DETECTING SYSTEM BASED ON INDUCTIVE SENSING

(71) Applicant: TEXAS INSTRUMENTS INCORPORATED, Dallas, TX (US)

(72) Inventors: George Pieter Reitsma, Redwood City, CA (US); Richard Dean Henderson, San Jose, CA (US); Jonathan Baldwin, Sunnyvale, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/333,033

(22) Filed: Oct. 24, 2016

(65) Prior Publication Data

US 2017/0038227 A1    Feb. 9, 2017

Related U.S. Application Data

(63) Continuation of application No. 14/139,701, filed on Dec. 23, 2013, now Pat. No. 9,479,134.

(60) Provisional application No. 61/877,759, filed on Sep. 13, 2013, provisional application No. 61/838,084, filed on Jun. 21, 2013, provisional application No. 61/772,290, filed on Mar. 4, 2013, provisional application No. 61/772,324, filed on Mar. 4, 2013.

(51) Int. Cl.
*G01B 7/14* (2006.01)
*G01D 5/20* (2006.01)
*H03H 2/00* (2006.01)

(52) U.S. Cl.
CPC ............. *G01D 5/202* (2013.01); *H03H 2/005* (2013.01)

(58) Field of Classification Search
CPC ...... G01P 3/488; G01D 5/202; G01D 5/2033; G01D 5/2013
USPC ....... 327/568, 498, 169, 192, 195, 196, 326, 327/397, 402; 324/207.15–207.19; 331/115, 132; 333/213, 214, 216, 217
See application file for complete search history.

(56) References Cited

U.S. PATENT DOCUMENTS 4,310,807 A * 1/1982 McKee .................. G01D 5/243
                                                            324/327
5,712,621 A    1/1998 Andersen
(Continued)

FOREIGN PATENT DOCUMENTS

CN    1157910 A    8/1997
CN    1215150 A    4/1999
(Continued)

OTHER PUBLICATIONS

PRC Search Report for Application No. 2014800120092.
(Continued)

*Primary Examiner* — Thomas Skibinski
(74) *Attorney, Agent, or Firm* — Andrew Viger; Charles A. Brill; Frank D. Cimino

(57) ABSTRACT

A position detecting system detects and responds to the movement of a target through a sensing domain area of a plane. The movement causes the amount of the target that lies within a sensing domain area to change. A portion of the target always lies within at least one of the sensing domain areas of the plane.

20 Claims, 10 Drawing Sheets

(56) References Cited

U.S. PATENT DOCUMENTS

| | | | | |
|---|---|---|---|---|
| 6,032,110 A | * | 2/2000 | Ishihara | G01B 7/31 |
| | | | | 324/207.11 |
| 8,432,169 B2 | * | 4/2013 | Niwa | H03K 17/9502 |
| | | | | 324/652 |
| 9,479,134 B2 | * | 10/2016 | Reitsma | H03H 2/005 |
| 2005/0280530 A1 | | 12/2005 | Lizza | |
| 2009/0140728 A1 | | 6/2009 | Rollins et al. | |
| 2009/0189600 A1 | * | 7/2009 | Kurkovskiy | G01D 5/2013 |
| | | | | 324/207.16 |
| 2014/0247040 A1 | * | 9/2014 | Reitsma | G01D 5/202 |
| | | | | 324/207.15 |

FOREIGN PATENT DOCUMENTS

| | | |
|---|---|---|
| CN | 2530242 Y | 1/2003 |
| CN | 1737388 A | 2/2006 |
| CN | 1871494 A | 11/2006 |
| CN | 101261137 A | 9/2008 |

OTHER PUBLICATIONS

U.S. Appl. No. 14/859,215, Inventor: Robert M. Hanrahan, title "Inductive Security Sensor Not Susceptible to Magnetic Tampering", filed Sep. 18, 2015.

* cited by examiner

POSITION DETECTING SYSTEM BASED ON INDUCTIVE SENSING

This application is a continuation of U.S. application Ser. No. 14/139,701, filed Dec. 23, 2013, now issued as U.S. Pat. No. 9,479,134, which claims benefit from Provisional Application No. 61/772,290 filed on Mar. 4, 2013 for George Pieter Reitsma, Provisional Application No. 61/772,324 filed on Mar. 4, 2013 for George Pieter Reitsma et al., Provisional Application No. 61/838,084 filed on Jun. 21, 2013 for George Pieter Reitsma et al., and Provisional Application No. 61/877,759 filed on Sep. 13, 2013 for Jonathan V. Baldwin et al.

BACKGROUND OF THE INVENTION

1. Field of the Invention

The present invention relates to detecting systems and, more particularly, to a position detecting system.

2. Description of the Related Art

An eddy current sensor is a position detecting system that commonly includes an inductor, a target, and a processing circuit. The inductor, which is typically implemented with a coil, senses changes in a time varying magnetic field that result from the movement of the target within the time varying magnetic field, while the processing circuit responds to changes in the time varying magnetic field that are sensed by the inductor.

For example, a proximity switch is a type of eddy current sensor that opens or closes a switch when an approaching target passes a point that lies a predetermined distance from the coil. Further, the proximity switch closes or opens the switch when a receding target passes the point that lies a predetermined distance from the coil.

The target has a surface that both faces the coil and lies in a plane substantially perpendicular to the longitudinal axis of the coil. The surface of the target has a center point that is aligned with the coil so that the longitudinal axis of the coil passes through the center point. A longitudinal distance between the target and the coil is measured along the longitudinal axis of the coil, between the coil and the center point.

In operation, the longitudinal distance between the coil and the target surface decreases or increases as the target moves. When the target is exposed to the time varying magnetic field, the time varying magnetic field induces eddy currents in the surface of the target, which causes the time varying magnetic field to lose power.

The power loss due to the eddy currents scales linearly with the total amount of magnetic flux that the target receives from the coil. Also, the mutual inductance between the target and the coil scales linearly with the same total amount of flux received by the target. Therefore, a proximity switching threshold that is based on power loss, inductance, or both corresponds to the amount of magnetic flux that is received by the target.

When the longitudinal distance between the target and sensor decreases, the magnetic flux received by the target increases which, in turn, increases the magnitudes of the eddy currents. The increase in the magnitudes of the eddy currents causes the time varying magnetic field to lose more power. A proximity switch detects the loss of power of the time varying magnetic field, and causes the switch to change states when the power loss of the time varying magnetic field falls below the threshold power level.

Since the threshold power level corresponds with the predetermined longitudinal distance, the proximity switch causes the switch to change states when the longitudinal distance between the target and sensor passes the point that lies the predetermined longitudinal distance from the sensor.

Similarly, when the longitudinal distance between the target and sensor increases, the magnitudes of the eddy currents decrease. The decrease in the magnitudes of the eddy currents causes the time varying magnetic field to lose less power. The proximity switch detects the loss of less power, and causes the switch to again change states when the power of the time varying magnetic field rises above the threshold power level.

Since the threshold power level corresponds with the predetermined longitudinal distance, the proximity switch causes the switch to again change states when the longitudinal distance between the sensor and a receding target passes the point that lies the predetermined longitudinal distance from the sensor.

The proximity switch, including the coil, the target, and the processing circuit, are connected to a support structure so that the target and the sensor can move with respect to each other. The processing circuit generates a signal in response to the measured energy loss or mutual inductance. In addition, the processing circuit generates a switch signal that controls the open or closed state of the switch in response to the energy of the time varying magnetic field rising above and falling below the threshold power level.

One of the disadvantages of the proximity switch is that the accuracy of this sensing technique decreases rapidly with the longitudinal distance to the coil, with the usable sensing range being limited to approximately 50% of the coil diameter. The power loss that is sensed by the coil corresponds to the total magnetic flux that is received by the target as the target moves along the longitudinal axis of the coil.

However, the magnetic flux density changes in a highly non-linear fashion along the longitudinal axis. Since the magnetic flux density changes in a highly non-linear fashion, the power loss that is sensed also has a highly non-linear dependence on position. As a result, the sensing accuracy decreases rapidly with longitudinal distance to the coil. Thus, there is a need for a position sensing technique that has position independent accuracy and an arbitrary sensing range.

SUMMARY OF THE INVENTION

The present invention provides a position detecting system that detects the position of a target. The position detecting system of the present invention includes a sensor that has a coil. The coil has a longitudinal axis. The coil generates a time varying magnetic field. The time varying magnetic field has a plurality of magnetic field vectors that intersect a sensing domain area of a plane. The plane is substantially orthogonal to the longitudinal axis. Each magnetic field vector that intersects the sensing domain area has a normal component that lies orthogonal to the plane and a tangent component that lies parallel to the plane. A magnitude of the normal component is substantially greater than a magnitude of the tangent component. An orientation of the normal component matches an orientation of the time varying magnetic field at an intersection of the longitudinal axis and the plane. The position detecting system also includes a target that moves within the plane. A portion of the target always lies within the sensing domain area of the plane. The position detecting system further includes a support structure that is connected to the sensor and the target.

A position detecting system in accordance with an alternate embodiment includes a first sensor that has a first coil. The first coil has a first longitudinal axis. The first coil generates a first time varying magnetic field. The first time varying magnetic field has a plurality of first magnetic field vectors that intersect a first sensing domain area of a plane. Each first magnetic field vector that intersects the first sensing domain area has a normal component that lies orthogonal to the plane and a tangent component that lies parallel to the plane. A magnitude of the normal component is substantially greater than a magnitude of the tangent component. An orientation of the normal component matches an orientation of the first time varying magnetic field at an intersection of the first longitudinal axis and the plane. The position detecting system also has a second sensor that has a second coil. The second coil has a second longitudinal axis. The second coil generates a second time varying magnetic field. The second time varying magnetic field has a plurality of second magnetic field vectors that intersect a second sensing domain area of the plane. The plane is substantially orthogonal to the first and second longitudinal axes. The position detecting system further has a target that moves within the plane. Some portion of the target always lies within at least one of the first and second sensing domain areas of the plane. The position detecting system additionally includes a support structure that is connected to the first sensor, the second sensor, and the target.

A position detecting system in accordance with an alternate embodiment includes a first sensor that has a first coil. The first coil has a first longitudinal axis. The first coil generates a first time varying magnetic field. The first time varying magnetic field has a plurality of first magnetic field vectors that intersect a first sensing domain area of a plane. Each first magnetic field vector that intersects the first sensing domain area has a normal component that lies orthogonal to the plane and a tangent component that lies parallel to the plane. A magnitude of the normal component is substantially greater than a magnitude of the tangent component. An orientation of the normal component matches an orientation of the first time varying magnetic field at an intersection of the first longitudinal axis and the plane. The position detecting system further includes a second sensor that has a second coil. The second coil has a second longitudinal axis. The second coil generates a second time varying magnetic field. The second time varying magnetic field has a plurality of second magnetic field vectors that intersect a second sensing domain area of the plane. The plane is substantially orthogonal to the first and second longitudinal axes. The position detecting system also includes a first target that moves within the plane, and a second target that moves within the plane. Some portion of the first target always lies within the first sensing domain area, or some portion of the second target always lies within the second sensing domain area. The position detecting system further includes a support structure that is connected to the first sensor, the first target, the second sensor, and the second target.

A position detecting system in accordance with an alternate embodiment includes a sensor that has a coil. The coil has a longitudinal axis. The coil generates a time varying magnetic field. The time varying magnetic field has a plurality of first magnetic field vectors that intersect a first sensing domain area of a first plane, and a plurality of second magnetic field vectors that intersect a second sensing domain area of a second plane. The first and second planes are substantially orthogonal to the longitudinal axis. Each first magnetic field vector that intersects the first sensing domain area has a normal component that lies orthogonal to the first plane and a tangent component that lies parallel to the first plane. A magnitude of the normal component is substantially greater than a magnitude of the tangent component. An orientation of the normal component matches an orientation of the time varying magnetic field at an intersection of the longitudinal axis and the first plane. The position detecting system also includes a first target and a second target. The first target moves within the first plane. The second target moves within the second plane. Some portion of the first target always lies within the first sensing domain area, or some portion of the second target always lies within the second sensing domain area. The position detecting system further includes a support structure that is connected to the sensor, the first target, and the second target.

A position detecting system in accordance with an alternate embodiment includes a first sensor that has a first coil. The first coil has a first longitudinal axis. The first coil generates a first time varying magnetic field. The first time varying magnetic field has a plurality of first magnetic field vectors that intersect a first sensing domain area of a first plane. The plurality of first magnetic field vectors that intersect the first sensing domain area each has a normal component that lies orthogonal to the first plane and a tangent component that lies parallel to the first plane. A magnitude of the normal component is substantially greater than a magnitude of the tangent component. An orientation of the normal component matches an orientation of the first time varying magnetic field at an intersection of the first longitudinal axis and the first plane. The position detecting system also includes a second sensor that has a second coil. The second coil has a second longitudinal axis. The second coil generates a second time varying magnetic field. The second time varying magnetic field has a plurality of second magnetic field vectors that intersect a second sensing domain area of the first plane. The position detecting system further includes a third sensor that has a third coil. The third coil has a third longitudinal axis. The third coil generates a third time varying magnetic field. The third time varying magnetic field has a plurality of third magnetic field vectors that intersect a third sensing domain area of a second plane. The position detecting system additionally includes a fourth sensor that has a fourth coil. The fourth coil has a fourth longitudinal axis. The fourth coil generates a fourth time varying magnetic field. The fourth time varying magnetic field has a plurality of fourth magnetic field vectors that intersect a fourth sensing domain area of the second plane. The first and second planes are substantially orthogonal to the first, second, third, and fourth longitudinal axes. The position detecting system also includes a first target that moves with the first plane, and a second target that moves within the second plane. Some portion of the first target always lies within the first sensing domain area or the second sensing domain area, or some portion of the second target always lies within the third sensing domain area or the fourth sensing area. The position detecting system further includes a support structure that is connected to the first, second, third, and fourth sensors and the first and second targets.

The present invention also provides a method of detecting a position. The method includes generating a time varying magnetic field with a coil. The coil has a longitudinal axis. The time varying magnetic field has a plurality of magnetic field vectors that intersect a sensing domain area of a plane. The plane is substantially orthogonal to the longitudinal axis. Each magnetic field vector that intersects the sensing domain area has a normal component that lies orthogonal to the plane and a tangent component that lies parallel to the plane. A magnitude of the normal component is substantially greater than a magnitude of the tangent component. An orientation of the normal component matches an orientation of the time varying magnetic field at an intersection of the longitudinal axis and the plane. The method also includes moving a target within the plane. A portion of the target always lies within the sensing domain area of the plane.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 3A is a first implementation example that measures the inductance coil characteristic, while FIG. 3B is a second implementation example that measures the Q factor coil characteristic.

DETAILED DESCRIPTION OF THE INVENTION

Figure 1:
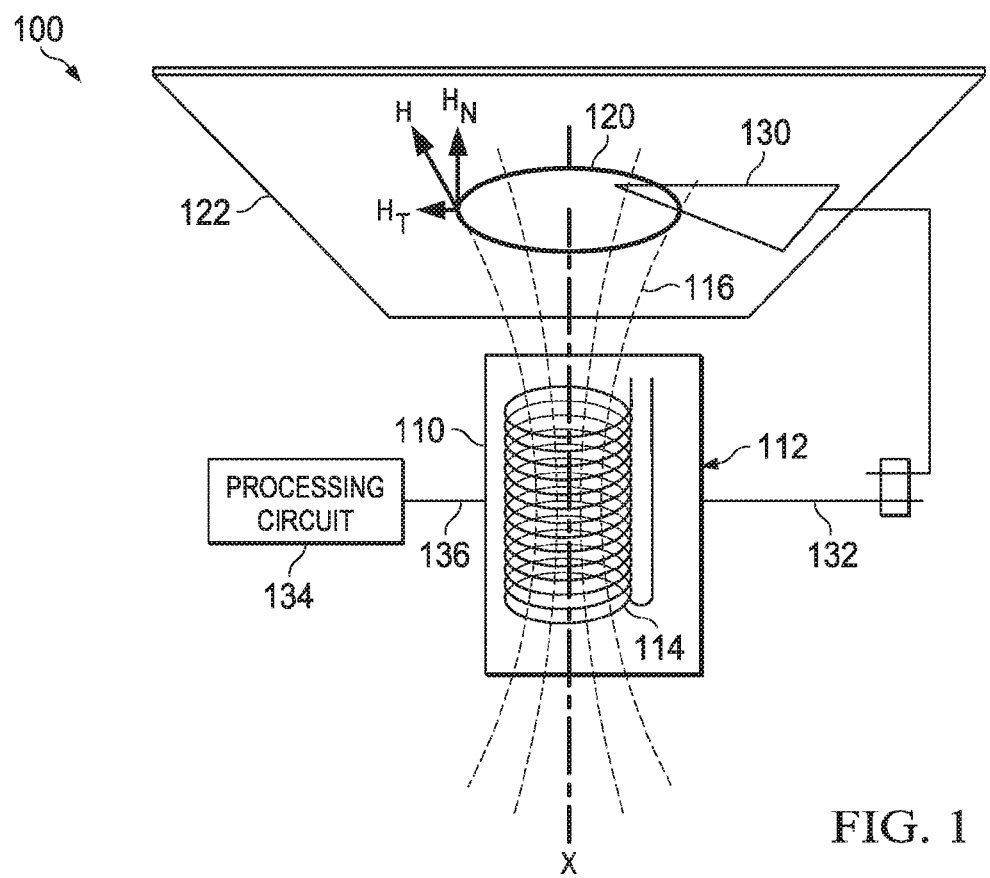
FIG. 1 is a diagram illustrating an example of a position detecting system 100 in accordance with the present invention.

This description and the figures disclose example embodiments and applications that illustrate various aspects and technical features of the invention disclosed and claimed in this specification. Known circuits, functions and operations are not described in detail to avoid unnecessarily obscuring the principles and features of the claimed invention.

A position detecting system of the present invention includes one or more coils, electronics that are connected to the coils, and one or more electrically conductive targets that are partially exposed to the magnetic fluxes of the one or more coils. The electronics sense the characteristics of the coils, such as the coil quality or Q factor at the excitation frequency or the inductances of the coils. Both are a function of the total amount of magnetic flux that a target receives from a coil.

The position of the one or more targets is determined within a plane that lies perpendicular to the longitudinal axes of the one or more coils at a substantially constant longitudinal distance from the one or more coils. The longitudinal axis of a coil is defined to be the line that passes through both the magnetic north and south poles of the magnetic field that is generated by the coil when the coil is excited by a DC electric current.

The longitudinal distance between a coil and a target is defined as the distance between the coil and the plane measured along the longitudinal axis. The distance is measured between a first point and a second point. The first point lies where the longitudinal axis of the coil intersects with the plane on the one side, while the second point lies where the longitudinal axis intersects with the area that is enclosed by the nearest turn of the coil on the other side.

The longitudinal distances, measured between the one or more coils and the plane in which the one or more targets are located, are sufficiently short such that the magnetic flux generated by the coils that intersects with the plane is mainly concentrated within sensing domains, where a sensing domain is a limited area of the plane.

The sensing domain (the limited area of the plane) is defined by three conditions: the magnetic field lines intersect with the plane in which the target is located; the normal components of the magnetic field lines are substantially larger than the tangential components; and the normal components have the same orientation as the normal component of the magnetic field that is observed at the intersection of the longitudinal axis of the coil and the plane.

The positions of the one or more targets in the plane are detected by determining for each target the percentage of the total magnetic flux it receives from each coil. Because the magnetic flux is concentrated within sensing domains in the plane in which the positions of targets are determined, the targets receive almost all of the magnetic flux from the coils within the areas where the targets overlap with the sensing domains of concentrated magnetic flux.

A change in the position of a target within the plane results in a change in the amount of overlap between a target and the one or more sensing domains of concentrated magnetic flux, which therefore results in a change in the percentage of magnetic flux that is received by that target.

In the simplest case, position is detected using a single target and a single coil by determining the magnetic flux the target receives from the coil. The coil response depends on the amount of overlap between the surface area of the target and the sensing domain of concentrated magnetic flux generated by the coil.

The accuracy and detection range can be improved by using a single target and multiple coils by determining the magnetic flux the target receives from the coils. In this embodiment, the response of each coil depends on the amount of overlap between the surface area of the target and the sensing domain of concentrated magnetic flux that is generated by that coil. The result is obtained by combining the measurements from all of the coils.

Accuracy and detection range can also be improved by using multiple targets that are connected together with a support structure, while using one sensing coil for each target. The position of the connected targets is detected by determining the magnetic flux each target receives from each coil. In this embodiment, the response of each coil depends on amount of overlap between the surface area of the target it is facing and the sensing domain of magnetic flux that is generated by that coil. The result is obtained by combining the measurements from all coils.

Accuracy and detection range can also be improved by using multiple targets that are connected together with a support structure, and using multiple sensing coils for each target. The position of the connected targets is detected by determining the amount of magnetic flux each target receives from each coil. In this embodiment, the response of each coil depends on the amount of overlap between the surface area of the target it is facing with the sensing domains of concentrated magnetic flux generated by that coil. The result is obtained by combining the measurements from each coil.

The sensor response to a change in the position of a target depends on the amount of the surface area of a target that lies within a sensing domain area of concentrated magnetic flux generated by the sensor. As a result, the response of the sensor to position is controlled by the shape of a target. Therefore, a shape can be chosen that optimizes the dynamic range in any application.

In an alternative embodiment, the targets can be located in two parallel planes, where both planes are located on different sides of the one or more coils, and both planes are substantially perpendicular with the longitudinal axes of the one or more coils. The longitudinal distance between each plane and the one or more coils is sufficiently short such that the magnetic flux generated by the coils that intersects with both planes is mainly concentrated within sensing domains.

The response of each coil in this embodiment depends on the sum of the overlap regions of surface areas of the two targets facing each side of the coil, and the sensing domain of magnetic flux generated by that coil. The targets on either side of the coil can be connected to a support structure, in which case a first order elimination of axial movement can be obtained. The targets can also move independently in which case a differential response to the movement of both targets can be obtained.

FIG. 1 shows a diagram that illustrates an example of a position detecting system 100 in accordance with the present invention. As described in greater detail below, position detecting system 100 determines the position of a target that moves within a time varying magnetic field.

As shown in FIG. 1, position detecting system 100 includes a sensor 110 that has an inductor 112. In the present example, inductor 112 is implemented with a coil 114. Coil 114 has a spiral shape, although other coil shapes, such as a planar shape, can alternately be used. In addition, coil 114 has a longitudinal axis X. The longitudinal axis of a coil is defined to be the line that passes through both the magnetic north and south poles of the magnetic field that is generated by the coil when the coil is excited by a DC electric current.

In operation, coil 114 generates a time varying magnetic field 116 which, in turn, has a number of magnetic field vectors H that intersect a sensing domain area 120 of a plane 122. Each magnetic field vector H that intersects the sensing domain area 120 has a normal component $H_N$ that lies orthogonal to plane 122, and a tangent component $H_T$ that lies parallel to plane 122.

Further, for each magnetic field vector H that intersects the sensing domain area 120, a magnitude of the normal component $H_N$ is substantially greater than a magnitude of the tangent component $H_T$. In addition, the orientation of the normal component $H_N$ is the same as the orientation of time varying magnetic field 116 at the intersection of the longitudinal axis X and plane 122. Plane 122, in turn, is substantially orthogonal to the longitudinal axis X. In addition, no portion of plane 122 passes through sensor 110.

As further shown in FIG. 1, position detecting system 100 also includes a target 130 that moves within plane 122. Target 130 has a limited range of movement within plane 122 so that some portion of target 130 always lies within the sensing domain area 120 of plane 122. In addition, the amount of target 130 that lies within the sensing domain area 120 changes as target 130 moves within the sensing domain area 120.

Position detecting system 100 additionally includes a support structure 132 that is connected to sensor 110 and target 130. Support structure 132 can include a single structure or any combination of structures or elements that allow sensor 110 and target 130 to move relative to each other.

For example, support structure 132 can hold sensor 110 in a fixed position and allow target 130 to move within plane 122. Alternately, support structure 132 can hold target 130 in a fixed position and allow sensor 110 to move in a plane that lies parallel to plane 122. Further, support structure 132 can allow both sensor 110 and target 130 to move.

Figure 2:
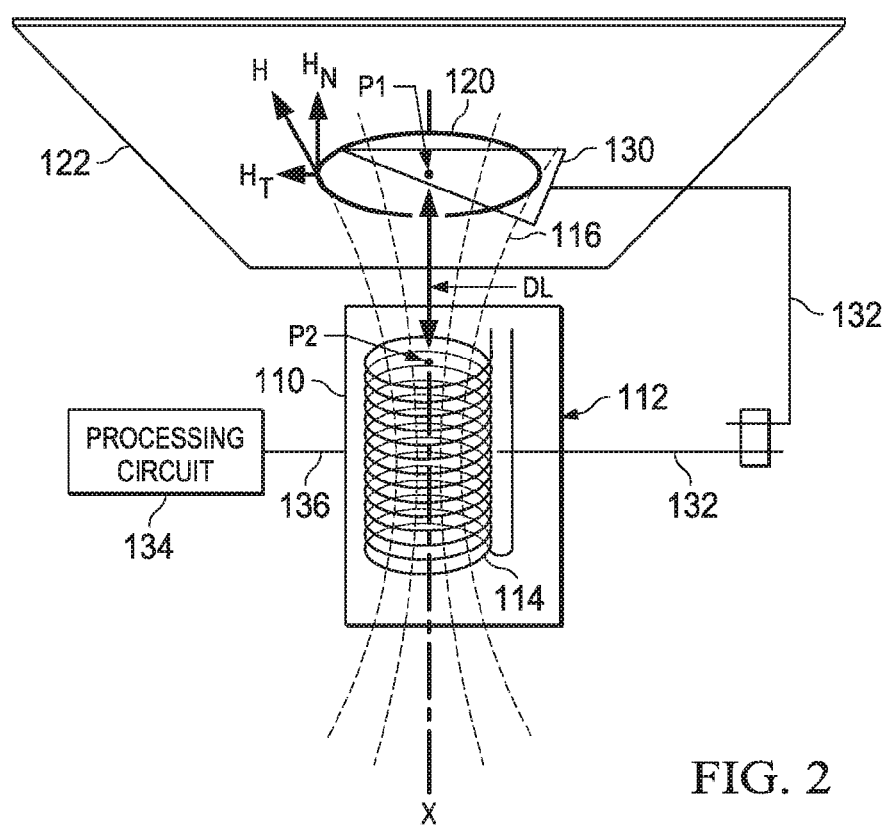
FIG. 2 is a diagram illustrating, in conjunction with FIG. 1, an example of the relative movement of sensor 110 and target 130 in accordance with the present invention.

FIG. 2 shows a diagram that illustrates, in conjunction with FIG. 1, an example of the relative movement of sensor 110 and target 130 in accordance with the present invention. FIGS. 1-2 can illustrate the case where target 130 moves substantially only within plane 122, while sensor 110 remains in a fixed position.

In this case, target 130 begins in an initial position as shown in FIG. 1, and moves laterally within plane 122 to a final position as shown in FIG. 2. In addition, instead of target 130 moving continuously from the initial position to the final position, target 130 can stop at any position between the initial position and the final position.

As shown in FIG. 2, plane 122 lies a longitudinal distance DL from coil 114. The longitudinal distance DL between coil 114 and plane 122 is defined as the distance measured between a first point P1 and a second point P2. The first point P1 lies where the longitudinal axis X of coil 114 intersects with plane 122 on the one side, while the second point P2 lies where the longitudinal axis X intersects with the area that is enclosed by the nearest turn of coil 114 on the other side.

Thus, as a result of target 130 moving substantially only within plane 122, target 130 continuously lies a substantially constant longitudinal distance DL from coil 114. Further, the direction of movement can be reversed so that the initial position of target 130 is shown in FIG. 2 and the final position of target 130 is shown in FIG. 1.

Alternately, FIGS. 1-2 can illustrate the case of where target 130 remains in a fixed position. When target 130 remains in a fixed position, sensor 110 moves within a plane that lies substantially parallel to plane 122 so that coil 114 continuously lies a substantially constant longitudinal distance DL from plane 122. In this case, sensor 110 begins in an initial position as shown in FIG. 1, and moves to a final position as shown in FIG. 2.

In addition, instead of sensor 110 moving continuously from the initial position to the final position, sensor 110 can stop at any position between the initial position and the final position. Further, the direction of movement can be reversed so that the initial position of sensor 110 is shown in FIG. 2 and the final position of sensor 110 is shown in FIG. 1.

As a result, target 130 moves within, and is movable within, time varying magnetic field 116 regardless of whether only target 130 physically moves, only sensor 110 physically moves, or both target 130 and sensor 110 physically move. In addition, regardless of whether target 130 physically moves, sensor 110 physically moves, or both target 130 and sensor 110 physically move, the longitudinal distance LD remains substantially constant when a relative movement between sensor 110 and target 130 changes the amount of target 130 that lies within the sensing domain area 120.

Referring again to FIG. 1, position detecting system 100 additionally includes a processing circuit 134 that is electrically connected to sensor 110 by a wiring assembly 136. Processing circuit 134 determines a position of sensor 110 with respect to the position of target 130 based on the response of sensor 110.

Processing circuit 134 can be implemented as an integrated circuit that is physically spaced apart from sensor 110 and target 130. In other words, processing circuit 134 and sensor 110 are not co-located. For example, sensor 110 can be located adjacent to a disc brake assembly in an automobile, where significant temperatures can be present, while integrated processing circuit 134 can be located away from the disc brake where substantially lower temperatures are present.

There are many other reasons why it can be beneficial to locate processing circuit 134 away from sensor 110. Not being co-located eliminates the need for routing the power and ground wires. It may also make economic sense to integrate the coil (which is inexpensive) with an assembly, while keeping all electronics in one box at another location.

In operation, target 130 is exposed to the time varying magnetic field 116. The magnetic flux from the time varying magnetic field 116 induces eddy currents in target 130, with the strongest eddy currents located in the portion of target 130 that lies within the sensing domain area 120.

The movement of target 130 within plane 122 (or sensor 110 within a plane parallel to plane 122) changes the amount of target 130 that lies within the sensing domain area 120. As a result, the movement changes the percentage of the total amount of magnetic flux generated by coil 114 that is received by target 130 which, in turn, changes the magnitudes of the eddy currents.

For example, the movement of target 130 from the position shown in FIG. 1 to the position shown in FIG. 2 increases the amount of target 130 that lies within the sensing domain area 120. As a result, the movement increases the percentage of the total amount of magnetic flux generated by coil 114 that is received by target 130 as well as the magnitudes of the eddy currents.

Similarly, the movement of target 130 from the position shown in FIG. 2 to the position shown in FIG. 1 decreases the amount of target 130 that lies within the sensing domain area 120. As a result, the movement decreases the percentage of the total amount of magnetic flux generated by coil 114 that is received by target 130 as well as the magnitudes of the eddy currents.

The changes in the percentage of magnetic flux received by target 130 and in the magnitudes of the eddy currents cause the electrical characteristics of coil 114 to change. For example, one coil characteristic that changes in response to changes in the percentage of magnetic flux received by target 130 is the inductance of coil 114. Another coil characteristic that changes in response to changes in the percentage of magnetic flux received by target 130 is the quality or Q factor of coil 114.

Processing circuit 134 then receives the coil characteristic from sensor 110, and determines the position of target 130 with respect to the position of sensor 110 in response to the coil characteristic. For a change in coil characteristic to be detectable by processing circuit 134, two criteria need to be met.

First, the change in characteristic must be significant with respect to the noise in the system. This includes noise from coil 114, noise received by coil 114 from the environment, and noise from processing circuit 134. Second, the change in characteristic must be significant with respect to the resolution of the system.

Figure 3A:
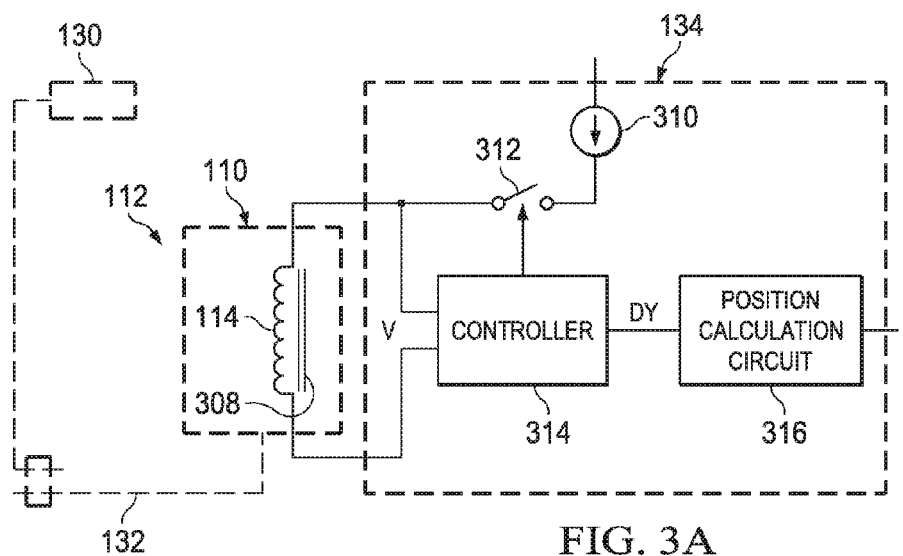
FIGS. 3A-3B are diagrams illustrating implementation examples of sensor 110 and processing circuit 134 in accordance with the present invention.
Figure 3B:
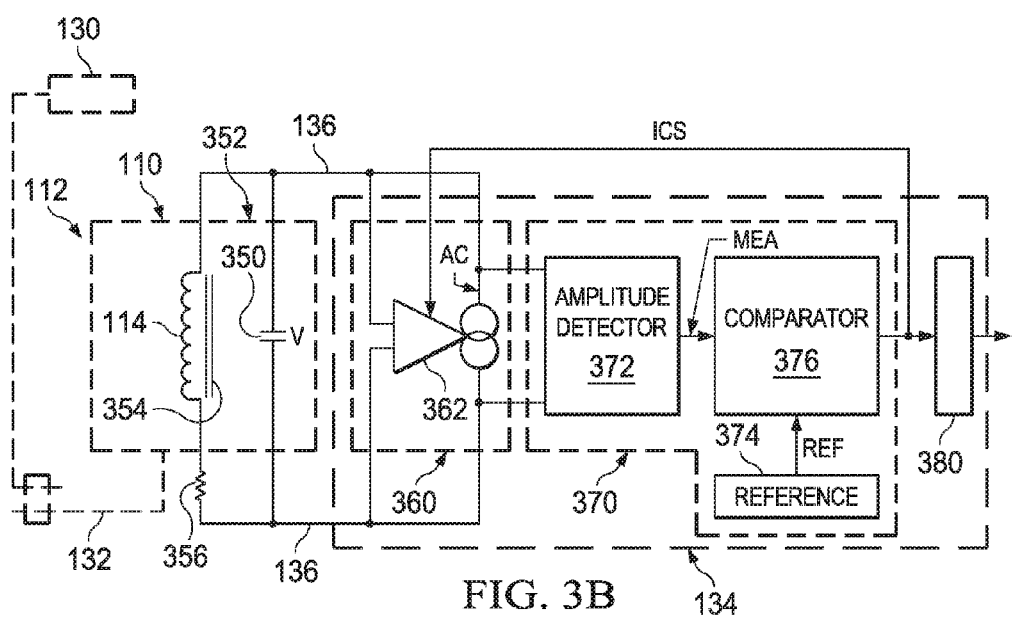

FIGS. 3A-3B show diagrams that illustrate implementation examples of sensor 110 and processing circuit 134 in accordance with the present invention. FIG. 3A shows a first implementation example that measures the inductance coil characteristic, while FIG. 3B shows a second implementation example that measures the Q factor coil characteristic.

As shown in FIG. 3A, sensor 110 is implemented with only coil 114 (optionally including a magnetic core 308), while processing circuit 134 is implemented with a current source 310 that sources a DC current into coil 114, and a switch 312 that is connected to coil 114 and current source 310.

Processing circuit 134 is also implemented with a controller 314 that controls the open and closed state of switch 312, and measures a voltage V across coil 114. Processing circuit 134 is further implemented with a position calculation circuit 316 that determines a position of target 110 with respect to the position of sensor 110 in response to a decay signal DY output by controller 314.

In operation, controller 314 closes switch 312 for a predetermined period of time, which allows current source 310 to source a current into coil 114. The current sourced into coil 114 generates a time varying magnetic field. Next, controller 314 opens switch 312, and then detects the decay of the voltage V across coil 114.

The magnetic field induces eddy currents to flow in target 130. The eddy currents weaken the magnetic field which, in turn, changes the rate that the voltage V decays across coil 114. Controller 314 measures the changes in the decay rates, and outputs the decay signal DY to represent the change in the decay rates. Position calculation circuit 316 then determines a position of target 130 with respect to the position of sensor 110 in response to the decay signal DY.

In a second implementation example, as shown in FIG. 3B, sensor 110 is implemented with coil 114 and a capacitor 350 that is connected to coil 114 to form a tank circuit 352. Although the FIG. 3B example illustrates coil 114 and capacitor 350 connected in parallel, coil 114 and capacitor 350 can alternately be connected in series.

In addition, coil 114 can optionally be wrapped around a magnetic core 354 to increase the strength of the time varying magnetic field. Further, tank circuit 352 includes wiring that provides the connections between coil 114 and capacitor 350. In FIG. 3B, the resistances of coil 114 and the wiring is represented as resistor 356. Coil 114, capacitor 350, and the wiring have a combined impedance Z in response to an alternating signal.

As further shown in FIG. 3B, processing circuit 134 is implemented with a negative impedance circuit 360 that is connected to tank circuit 352. Negative impedance circuit 360 compensates exactly for the positive resonance impedance of tank circuit 352 to enable steady state oscillation. Negative impedance circuit 360 can be implemented in a number of different ways which are well known to those skilled in the art. In the present example, negative impedance circuit 360 is implemented with a transconductance amplifier 362, configured as a negative impedance.

As additionally shown in FIG. 3B, processing circuit 134 is also implemented with an amplitude control circuit 370 that detects a change in the amplitude of an alternating signal V, and outputs an impedance control signal ICS to negative impedance circuit 360 in response to the change. The impedance control signal ICS identifies changes to the amount of power that is supplied to tank circuit 352 so that the time varying magnetic field can continue to oscillate at a substantially constant amplitude.

In the present example, amplitude control circuit 370 includes an amplitude detector 372 that measures the amplitude of the alternating voltage V across tank circuit 352, and outputs a measured amplitude signal MEA in response. Amplitude control circuit 370 also includes a reference circuit 374 that outputs a reference signal REF that corresponds to the oscillation amplitude of alternating voltage V.

Further, amplitude control circuit 370 additionally includes a comparator output circuit 376 that compares the measured amplitude signal MEA to the reference amplitude signal REF, and generates the impedance control signal ICS based on the difference between the measured amplitude signal MEA and the reference amplitude signal REF.

As also shown in FIG. 3B, processing circuit 134 is further implemented with a translator 380 that is connected to receive the impedance control signal ICS output from comparator output circuit 376. Translator 380, which can include a look-up table, outputs a position of target 130 in response to the impedance control signal ICS.

In operation, electrical energy flows back and forth between coil 114 and capacitor 350 in tank circuit 352, oscillating at a frequency that is defined by the values of the coil 114 and capacitor 350. The amplitude of the oscillation is kept constant by the negative impedance circuit 360, which makes up for the positive impedance of tank circuit 352.

An ideal tank circuit oscillating at the resonant frequency is lossless, alternately storing the energy in the inductor and capacitor. Real world tank circuits, however, are not lossless, but continuously lose a small amount of energy due to the resistance 356 associated with the coil 114, losses of the capacitor 350, the wires that connect the coil 114 and capacitor 350 together, and the eddy current losses that the magnetic field generated by coil 114 induces in target 130.

Thus, a small amount of additional maintenance energy must be provided by negative impedance circuit 360 to tank circuit 352. The small amount of additional maintenance energy allows tank circuit 352 to overcome the energy loss due to the losses in both tank circuit 352 and in target 130, and allows tank circuit 352 to maintain steady oscillation.

In the present example, amplitude detector 372 generates the measured amplitude signal MEA to represent the changes in the amplitude of the time varying magnetic field by measuring changes in the amplitude of the alternating voltage V across tank circuit 352. Comparator output circuit 374 receives the measured amplitude signal MEA, compares the measured amplitude signal MEA to the reference amplitude signal REF from reference circuit 376, and outputs the impedance control signal ICS in response to the difference between the measured amplitude signal MEA and the reference amplitude signal REF. Negative impedance circuit 360 responds to the impedance control signal ICS by adjusting the negative impedance in order to match and compensate for the positive impedance of tank circuit 352 to maintain the oscillation amplitude at a level that is equal to the amplitude reference REF provided by comparator output circuit 374.

Thus, after tank circuit 352 begins to oscillate at the resonant frequency, negative impedance circuit 360 provides the maintenance energy required by tank circuit 352 to cancel out the positive impedance of tank circuit 352 to maintain oscillation amplitude of sensor 110 at the amplitude reference REF provided by reference circuit 374.

With target 130 lying within the time varying magnetic field generated by tank circuit 352, the time varying magnetic field induces eddy currents to flow in target 130. The eddy currents, which have the same effect as a resistor placed across tank circuit 352, change the amplitude of the time varying magnetic field.

As a result, the positive impedance of tank circuit 352 decreases, such that the amplitude of the alternating voltage V across tank circuit 352 decreases. Amplitude detector 372 measures the changes in the amplitude of the time varying magnetic field by measuring changes in the amplitude of the alternating voltage V, and generates the measured amplitude signal MEA in response.

Comparator output circuit 376 receives the measured amplitude signal MEA, compares the measured amplitude signal MEA to the reference amplitude signal REF, and outputs the impedance control signal ICS in response to the difference between the measured amplitude signal MEA and the reference amplitude signal REF. Negative impedance circuit 360 responds to the impedance control signal ICS by decreasing the magnitude of the negative impedance in order to match the lower positive impedance of tank circuit 352 so that steady state oscillation of tank circuit 352 is restored at an oscillation amplitude of alternating voltage V that equals the reference amplitude signal REF provided by reference circuit 374.

Thus, in response to target 130 lying within the time varying magnetic field, which initially reduces the amplitude of the time varying magnetic field, amplitude control circuit 370 detects the falling amplitude and outputs the impedance control signal ICS. In response to the impedance control signal ICS, negative impedance circuit 360 decreases the magnitude of its negative impedance to cancel out the decrease of the positive resonance impedance of tank circuit 352 that results from the presence of target 130 in the time varying magnetic field.

As a result, FIG. 3B illustrates an example functional embodiment of a resonant sensor system which is based on establishing at the output of a resonant sensor a negative impedance controller that maintains a substantially constant sensor output resonant amplitude, thereby establishing a sensor control loop in which the controlled negative impedance corresponds to the response of the sensor to the target according to aspects of the claimed invention disclosed in this specification.

Figure 4A:
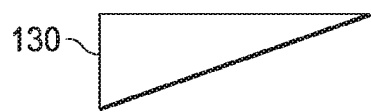
FIGS. 4A-4M are a series of views illustrating examples of the shapes of target 130 in accordance with the present invention.
Figure 4B:
Figure 4C:
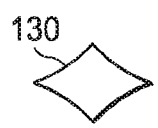
Figure 4D:

FIGS. 4A-4M show a series of views that illustrate examples of the shapes of target 130 in accordance with the present invention. As shown in FIG. 4A, target 130 can be shaped as a right triangle. As shown in FIG. 4B, target 130 can be shaped as an isosceles triangle. As shown in FIG. 4C, target 130 can be shaped as a diamond with concave sides. As shown in FIG. 4D, target 130 can be shaped as two end-to-end diamonds with concave sides.

Figure 4E:
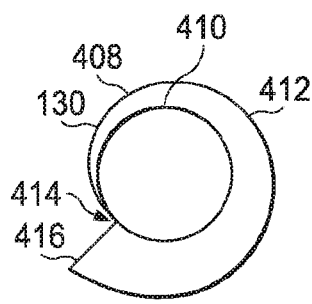
Figure 4F:

As shown in FIG. 4E, target 130 can be shaped as a curved structure 408 that has two sides 410 and 412 that continuously curve in the same direction, and continuously get further apart. Further, curved structure 408 extends 360° from a point 414 to an end side 416 that touches point 414. As shown in FIG. 4F, target 130 can be shaped as a right triangle with a concave hypotenuse.

Figure 4G:
Figure 4H:
Figure 4I:
Figure 4J:
Figure 4K:
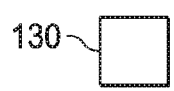

As shown in FIG. 4G, target 130 can be shaped as an isosceles triangle with concave sides that are attached to a base side. As shown in FIG. 4H, target 130 can be shaped as a right triangle with a convex hypotenuse. As shown in FIG. 4I, target 130 can be shaped as an isosceles triangle with convex sides that are attached to a base side. As shown in FIG. 4J, target 130 can be shaped as a circle. As shown in FIG. 4K, target 130 can be shaped as a square or rectangle.

Figure 4L:

As shown in FIG. 4L, target 130 can be a triangular slot in a larger sheet of conductive material. Target 130 in FIG. 4L is an example of an inverse target. For example, target 130 in FIG. 4A and target slot 130 in FIG. 4L generate opposite responses when the outer dimensions of the two right triangles are the same. Further, all of the shapes shown in FIGS. 4A-4K can have an inverted counterpart as illustrated by FIG. 4L.

Figure 4M:
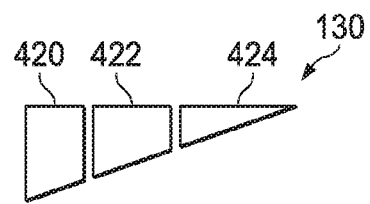

In addition, as shown in FIG. 4M, target 130 can be formed with a number of spaced-apart portions, such as portions 420, 422, and 424, that together suggest a right triangle shape. Target 130 in FIG. 4M is an example of a segmented target. Segmented targets are useful in providing strain relief.

Figure 5:
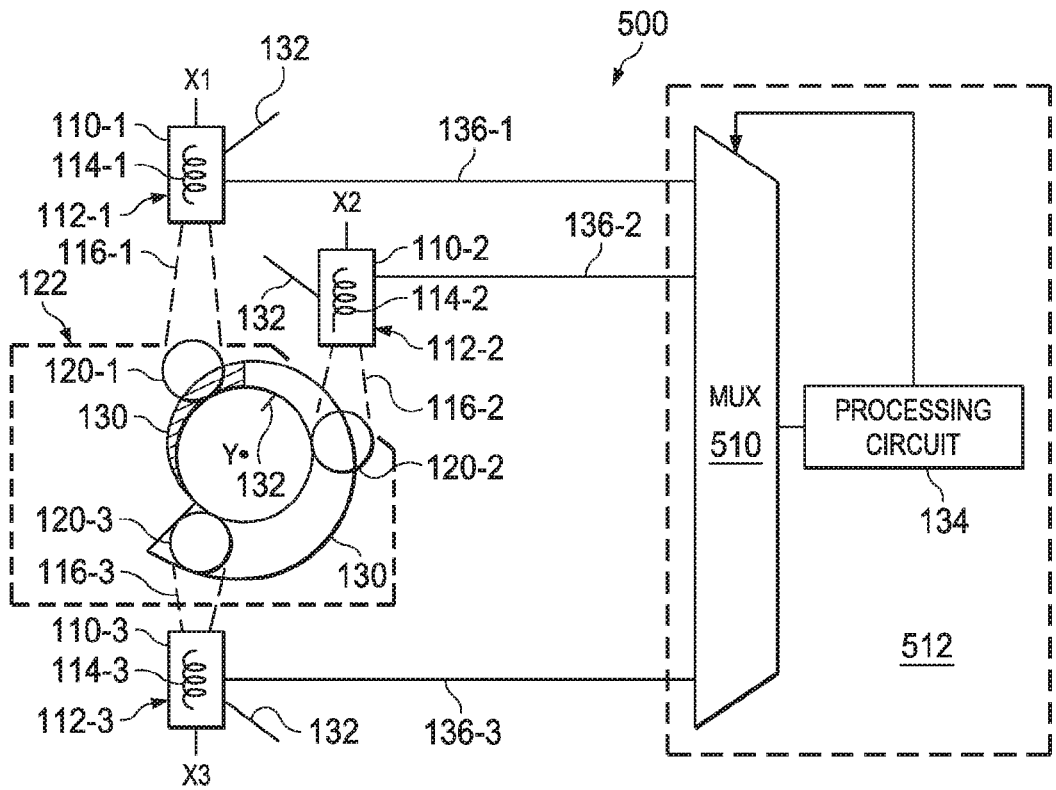
FIG. 5 is a diagram illustrating an example of a position detecting system 500 in accordance with an alternate embodiment of the present invention.

FIG. 5 shows a diagram that illustrates an example of a position detecting system 500 in accordance with an alternate embodiment of the present invention. Position detecting system 500 is the same as position detecting system 100, except that position detecting system 500 utilizes multiple sensors 110 in lieu of a single sensor 110.

The FIG. 5 example illustrates three sensors 110-1, 110-2, and 110-3 with three inductors 112-1, 112-2, and 112-3. The three inductors 112-1, 112-2, and 112-3 are implemented with three coils 114-1, 114-2, and 114-3, which have three longitudinal axes X1, X2, and X3 that are each substantially orthogonal to plane 122. In addition, the three coils 114-1, 114-2, and 114-3 generate three time varying magnetic fields 116-1, 116-2, and 116-3.

As with sensor 110, the time varying magnetic field 116-1 has a number of magnetic field vectors that intersect a sensing domain area 120-1 of plane 122, the time varying magnetic field 116-2 has a number of magnetic field vectors that intersect a sensing domain area 120-2 of plane 122, and the time varying magnetic field 116-3 has a number of magnetic field vectors that intersect a sensing domain area 120-3 of plane 122.

In addition, each magnetic field vector that intersects a sensing domain area has a normal component that lies orthogonal to plane 122 and a tangent component that lies parallel to plane 122. Further, a magnitude of the normal component is substantially greater than a magnitude of the tangent component. In addition, the orientation of each normal component, the orientation of the time varying magnetic field 116-1 at the intersection of the longitudinal axis X1 and plane 122, the orientation of the time varying magnetic field 116-2 at the intersection of the longitudinal axis X2 and plane 122, and the orientation of the time varying magnetic field 116-3 at the intersection of the longitudinal axis X3 and plane 122 are the same.

Position detecting system 500 also differs from position detecting system 100 in that target 130 is implemented as a curved structure, such as the curved structure 408 shown in FIG. 4E. In the FIG. 5 example, some portion of target 130 always lies within the sensing domain area 120-1, some portion of target 130 always lies within the sensing domain area 120-2, and some portion of target 130 always lies within the sensing domain area 120-3.

Further, the amount of target 130 that lies within the sensing domain area 120-1 changes as target 130 moves, the amount of target 130 that lies within the sensing domain area 120-2 changes as target 130 moves, and the amount of target 130 that lies within the sensing domain area 120-3 changes as target 130 moves.

In addition, position detecting system 500 has three wiring assemblies 136-1, 136-2, and 136-3 that are connected to the outputs of the three sensors 110-1, 110-2, and 110-3, and a multiplexor 510 that is connected to processing circuit 134 and the three wiring assemblies 136-1, 136-2, and 136-3.

Processing circuit 134 and multiplexor 510 can be formed in an integrated circuit 512 that is physically spaced apart from the sensors 110-1, 110-2, and 110-3. In other words, integrated circuit 512 and the sensors 110-1, 110-2, and 110-3 are not co-located. For example, the sensors 110-1, 110-2, and 110-3 can be located adjacent to a disc brake assembly in an automobile, where significant temperatures can be present, while integrated circuit 512 can be located away from the disc brake where substantially lower temperatures are present.

There are many other reasons why it can be beneficial to locate integrated circuit 512 away from the sensors 110-1, 110-2, and 110-3. Not being co-located eliminates the need for routing the power and ground wires. It may also make economic sense to integrate the coils (which are inexpensive) with an assembly, while keeping all electronics in one box at another location.

In operation, target 130 is exposed to a first time varying magnetic field generated by coil 114-1, a second time varying magnetic field generated by coil 114-2, and a third time varying magnetic field generated by coil 114-3. The magnetic fluxes from the three time varying magnetic fields induce eddy currents in target 130, with the strongest eddy currents located in the portions of target 130 that lie within the sensing domain areas 120-1, 120-2, and 120-3.

As shown in FIG. 5, the rotation of target 130 about an axis Y, such as by the rotational motion of a rotating shaft, changes the amount of target 130 that lies within each of the sensing domain areas 120-1, 120-2, and 120-3 changes. As a result, the rotation changes the percentage of the total amount of magnetic flux generated by the coils 114-1, 114-2, and 114-3 that is received by target 130 which, in turn, changes the magnitudes of the eddy currents.

The changes in the percentage of magnetic flux received by target 130 and in the magnitudes of the eddy currents cause the electrical characteristics (e.g., inductance and Q factor) of the coils 114-1, 114-2, and 114-3 to change. Thus, coil 114-1 has a coil characteristic that changes as target 130 moves within the sensing domain area 120-1, coil 114-2 has a coil characteristic that changes as target 130 moves within the sensing domain area 120-2, and coil 114-3 has a coil characteristic that changes as target 130 moves within the sensing domain area 120-3.

Multiplexor 510 selectively passes the changed coil characteristics from the sensors 110-1, 110-2, and 110-3 to processing circuit 134 under the control of processing circuit 134. Processing circuit 134 then determines the position of target 130 with respect to the positions of the sensors 110-1, 110-2, and 110-3 in response to the coil characteristics.

In an alternate embodiment, target 130 can be implemented with the hatched-in portion shown in FIG. 5. In this embodiment, the rotation of target 130 about the axis Y causes some portion of hatched target 130 to always lie within at least one of the sensing domain areas 120-1, 120-2, and 120-3.

In a further embodiment, target 130 can begin over a portion of a first sensing domain area, then be extended in a direction to gradually cover all of the first sensing domain area, further extended in the direction to gradually cover all of the first and second sensing domain areas, and yet be further extended in the direction to gradually cover all of the first, second, and third sensing domain areas.

Figure 6:
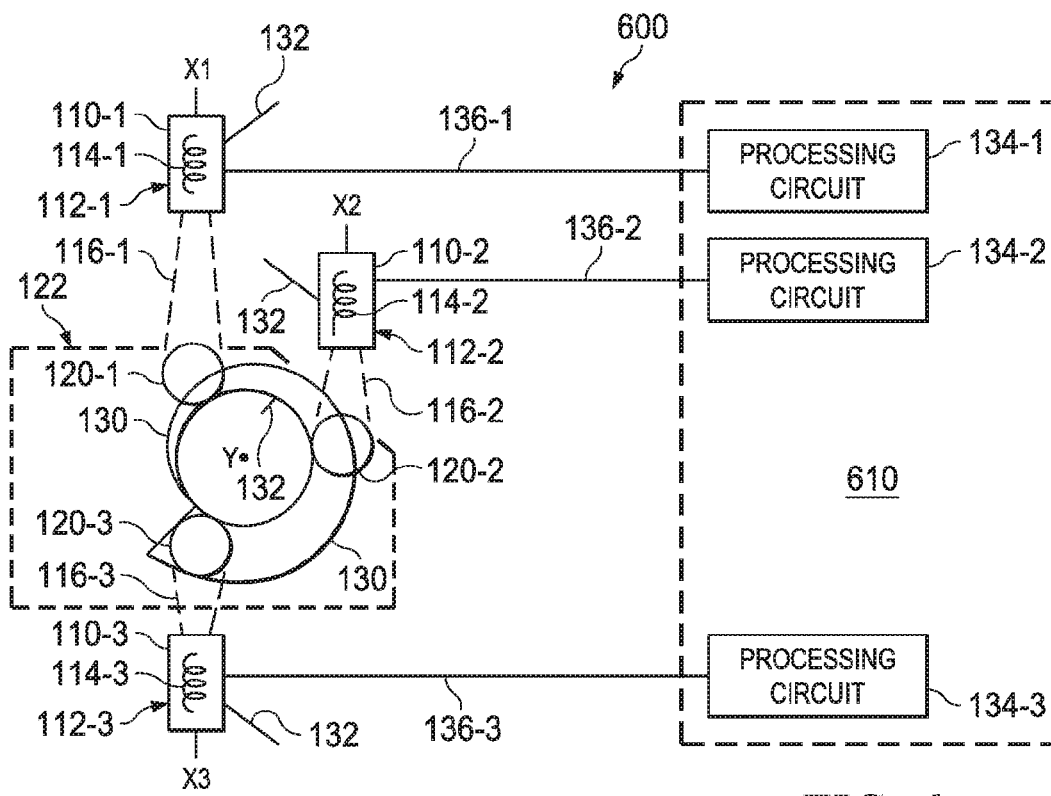
FIG. 6 is a diagram illustrating an example of a position detecting system 600 in accordance with an alternate embodiment of the present invention.

FIG. 6 shows a diagram that illustrates an example of a position detecting system 600 in accordance with an alternate embodiment of the present invention. Position detecting system 600 is the same as position detecting system 500, except that position detecting system 600 utilizes multiple processing circuits 134 in lieu of multiplexor 510 and the single processing circuit 134 shown in FIG. 5.

The FIG. 6 example illustrates three processing circuits 134-1, 134-2, and 134-3 that are directly connected to the three sensors 110-1, 110-2, and 110-3 by the three wiring assemblies 136-1, 136-2, and 136-3. The three processing circuits 134-1, 134-2, and 134-3 can be formed in an integrated circuit 610 that is physically spaced apart from the sensors 110-1, 110-2, and 110-3 and target 130. In other words, integrated circuit 610 and the sensors 110-1, 110-2, and 110-3 are not co-located.

For example, the sensors 110-1, 110-2, and 110-3 can be located adjacent to a disc brake assembly in an automobile, where significant temperatures can be present, while integrated circuit 610 with the three processing circuits 134-1, 134-2, and 134-3 can be located away from the disc brake where substantially lower temperatures are present.

There are many other reasons why it can be beneficial to locate integrated circuit 610 away from the sensors 110-1, 110-2, and 110-3. Not being co-located eliminates the need for routing the power and ground wires. It may also make economic sense to integrate the coils (which are inexpensive) with an assembly, while keeping all electronics in one box at another location.

Position detecting system 600 operates the same as position detecting system 500 except that position detecting system 600 utilizes the three processing circuits 134-1, 134-2, and 134-3 to process the responses from the sensors 110-1, 110-2, and 110-3.

Figure 7A:
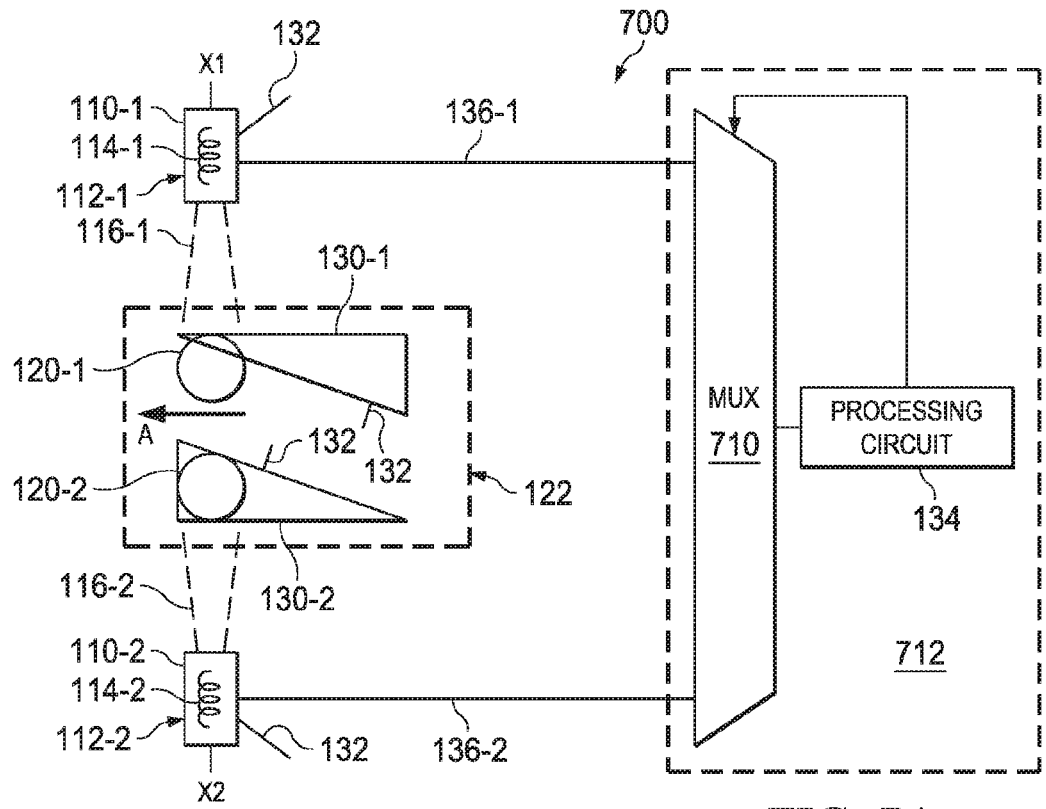
FIG. 7A is a diagram illustrating an example of a position detecting system 700 in accordance with an alternate embodiment of the present invention.

FIG. 7A shows a diagram that illustrates an example of a position detecting system 700 in accordance with an alternate embodiment of the present invention. Position detecting system 700 is the same as position detecting system 100, except that position detecting system 700 utilizes multiple sensors 110 in lieu of a single sensor 110.

The FIG. 7A example illustrates two sensors 110-1 and 110-2 with two inductors 112-1 and 112-2. The two inductors 112-1 and 112-2 are implemented with two coils 114-1 and 114-2 which have two longitudinal axes X1 and X2. In addition, the two coils 114-1 and 114-2 generate two time varying magnetic fields 116-1 and 116-2.

As with sensor 110, the time varying magnetic field 116-1 has a number of magnetic field vectors that intersect a sensing domain area 120-1 of plane 122, and the time varying magnetic field 116-2 has a number of magnetic field vectors that intersect a sensing domain area 120-2 of plane 122.

Each magnetic field vector that intersects a sensing domain area has a normal component that lies orthogonal to plane 122 and a tangent component that lies parallel to plane 122. Further, a magnitude of the normal component is substantially greater than a magnitude of the tangent component.

In addition, the orientation of each normal component, the orientation of the time varying magnetic field 116-1 at the intersection of the longitudinal axis X1 and plane 122, and the orientation of the time varying magnetic field 116-2 at the intersection of the longitudinal axis X2 and plane 122 are the same. Plane 122, in turn, is substantially orthogonal to each of the two longitudinal axes X1 and X2.

Position detecting system 700 also differs from position detecting system 100 in that position detecting system 700 utilizes multiple targets 130 in lieu of a single target 130. The FIG. 7A example illustrates two targets 130-1 and 130-2 which are implemented as right triangles, and oriented with facing hypotenuses in a reverse inverted position.

Some portion of target 130-1 always lies within the sensing domain area 120-1, and some portion of target 130-2 always lies within the sensing domain area 120-2. Further, the amount of target 130 that lies within the sensing domain area 120-1 changes as target 130 moves, and the amount of target 130 that lies within the sensing domain area 120-2 changes as target 130 moves.

Position detecting system 700 also differs from position detecting system 100 in that position detecting system 700 has two wiring assemblies 136-1 and 136-2 that are connected to the outputs of the two sensors 110-1 and 110-2, and a multiplexor 710 that is connected to processing circuit 134 and the two wiring assemblies 136-1 and 136-2.

Processing circuit 134 and multiplexor 710 can be formed in an integrated circuit 712 that is physically spaced apart from the sensors 110-1 and 110-2. In other words, integrated circuit 712 and the sensors 110-1 and 110-2 are not co-located. For example, the sensors 110-1 and 110-2 can be located adjacent to a disc brake assembly in an automobile, where significant temperatures can be present, while integrated circuit 712 that has processing circuit 134 and multiplexor 710 can be located away from the disc brake where substantially lower temperatures are present.

There are many other reasons why it can be beneficial to locate integrated circuit 712 away from the sensors 110-1 and 110-2. Not being co-located eliminates the need for routing the power and ground wires. It may also make economic sense to integrate the coil (which is inexpensive) with an assembly, while keeping all electronics in one box at another location. Further, support structure 132 is connected to the sensors 110-1 and 110-2, and the targets 130-1 and 130-2.

In operation, target 130-1 is exposed to a first time varying magnetic field 116-1 generated by coil 114-1, while target 130-2 is exposed to a second time varying magnetic field 116-2 generated by coil 114-2. The magnetic flux from the first time varying magnetic field 116-1 induces eddy currents in target 130-1, with the strongest eddy currents located in the portions of target 130-1 that lie within the sensing domain area 120-1. Similarly, the magnetic flux from the second time varying magnetic field 116-2 induces eddy currents in target 130-2, with the strongest eddy currents located in the portions of target 130-2 that lie within the sensing domain area 120-2.

As shown in FIG. 7A, the simultaneous movement of targets 130-1 and 130-2 in the direction of arrow A, such as when targets 130-1 and 130-2 are connected together, changes the amount of target 130-1 that lies within the sensing domain area 120-1, and the amount of target 130-2 that lies within the sensing domain area 120-2. (Although the present example illustrates simultaneous movement of targets 130-1 and 130-2, targets 130-1 and 130-2 can alternately be independently moved at the same or different rates. In addition, after moving in the direction of arrow A, the targets 130-1 and 130-2 can move in the opposite direction.) As a result, the movement changes the percentages of the total amount of magnetic flux generated by the coils 114-1 and 114-2 that are received by the targets 130-1 and 130-2 which, in turn, changes the magnitudes of the eddy currents in the targets 130-1 and 130-2.

Since the targets 130-1 and 130-2 are oriented with facing hypotenuses in a reverse inverted position, the movement causes the percentage of magnetic flux received by one target 130 to increase, while causing the percentage of magnetic flux received by the other target 130 to decrease. As a result, the magnitudes of the eddy currents in one target 130 increase, while the magnitudes of the eddy currents in the other target 130 decrease.

The changes in the percentages of magnetic flux received by the targets 130-1 and 130-2, and in the magnitudes of the eddy currents, cause the electrical characteristics (e.g., inductance and Q factor) of the coils 114-1 and 114-2 to change. Thus, coil 114-1 has a first coil characteristic that changes as target 130-1 moves within the sensing domain area 120-1 of plane 122, and coil 114-2 has a second coil characteristic that changes as target 130-2 moves within the sensing domain area 120-2 of plane 122.

Multiplexor 710 selectively passes the changed coil characteristics from the sensors 110-1 and 110-2 to processing circuit 134 under the control of processing circuit 134. Processing circuit 134 then determines the position of target 130-1 with respect to the position of sensor 110-1 in response to the first coil characteristic, and the position of target 130-2 with respect to the position of sensor 110-2 in response to the second coil characteristic.

One of the advantages of position detecting system 700 is that position detecting system 700 can eliminate errors that result from movement in the axial or longitudinal direction. Although movement of the targets 130-1 and 130-2 is limited to plane 122, mechanical tolerances in support structure 132 can introduce a small amount of non-planar movement.

Figure 7B:
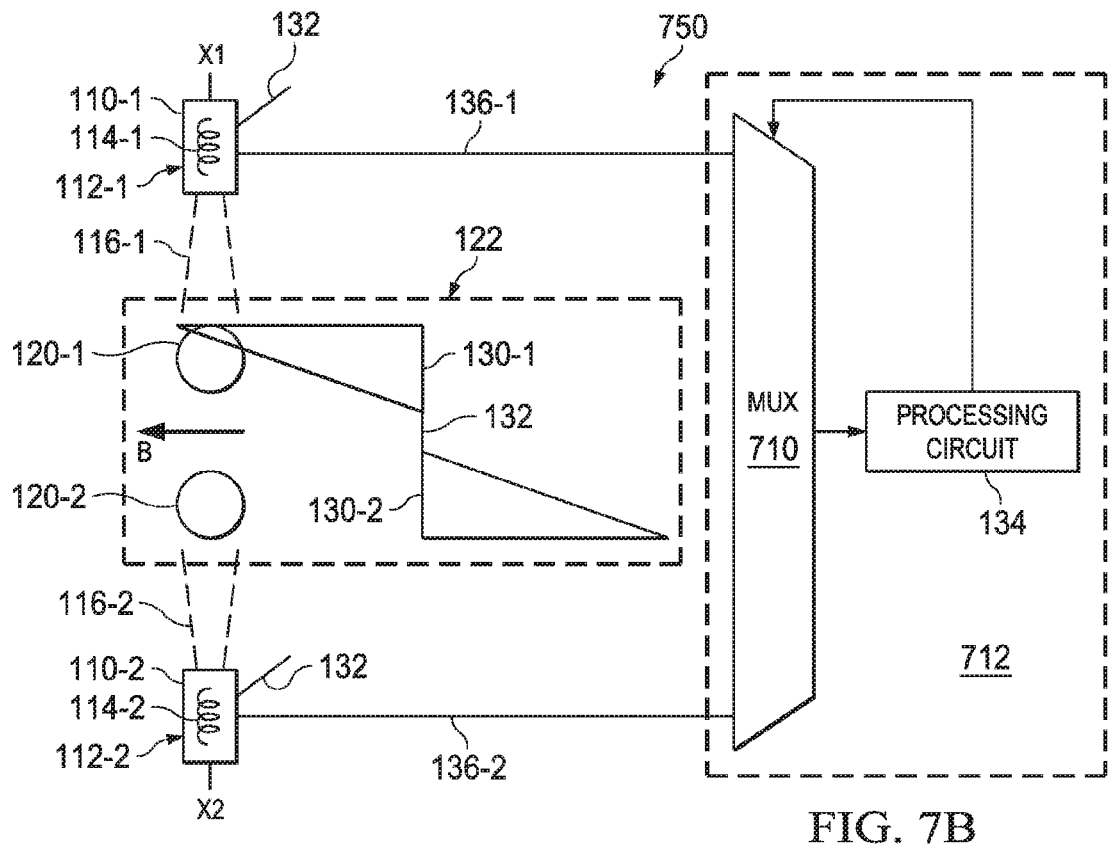
FIG. 7B is a diagram illustrating an example of a position detecting system 750 in accordance with an alternate embodiment of the present invention.

FIG. 7B shows a diagram that illustrates an example of a position detecting system 750 in accordance with an alternate embodiment of the present invention. Position detecting system 750 is the same as position detecting system 700, except that the targets 130-1 and 130-2 are staggered.

As shown in FIG. 7B, the simultaneous movement of targets 130-1 and 130-2 in the direction of arrow B causes some portion of target 130-1 to always lie within sensing domain area 120-1, or some portion of target 130-2 to always lie within sensing domain area 120-2. In other words, one of the targets 130-1 or 130-2 can leave a sensing domain area as long as the other target 130-1 or 130-2 remains in a sensing domain area. (After moving in the direction of arrow B, the targets 130-1 and 130-2 can move in the opposite direction.)

Figure 8:
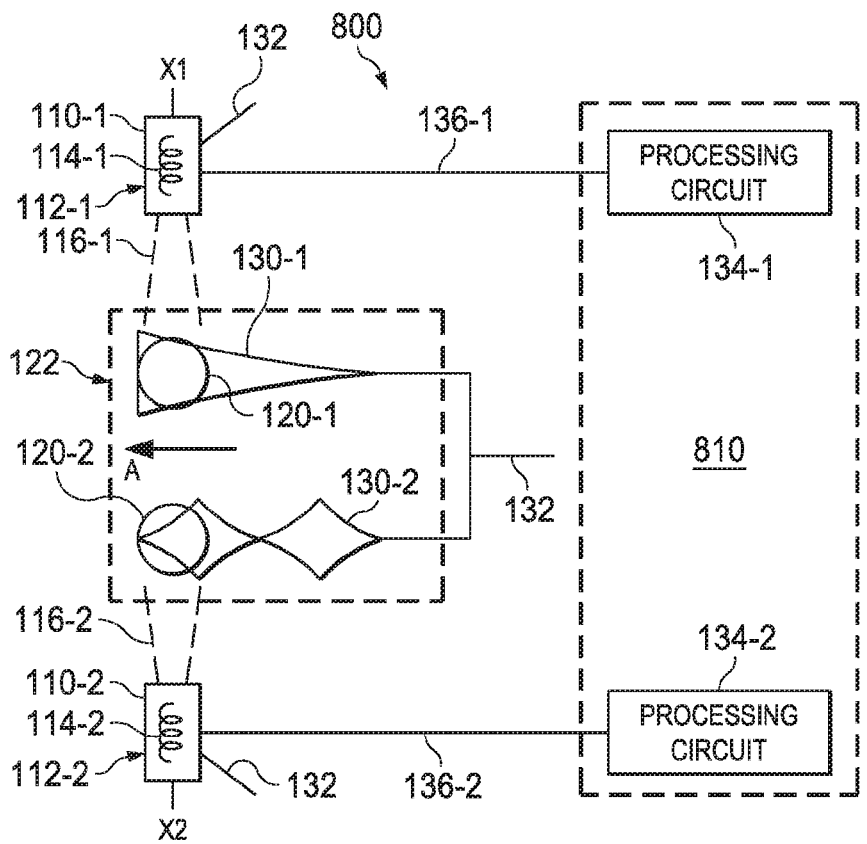
FIG. 8 is a diagram illustrating an example of a position detecting system 800 in accordance with an alternate embodiment of the present invention.

FIG. 8 shows a diagram that illustrates an example of a position detecting system 800 in accordance with an alternate embodiment of the present invention. Position detecting system 800 is the same as position detecting system 700, except that position detecting system 800 utilizes two processing circuits 134-1 and 134-2 in lieu of multiplexor 710 and the single processing circuit 134 shown in FIG. 7A. (Position detecting system 800 can also be the same as position detecting system 750, except that position detecting system 800 utilizes two processing circuits 134-1 and 134-2 in lieu of multiplexor 710 and the single processing circuit 134 shown in FIG. 7B.)

As a result, the two sensors 110-1 and 110-2 are directly connected to the two processing circuits 134-1 and 134-2 by the two wiring assemblies 130-1 and 130-2. The two processing circuits 134-1 and 134-2 can be formed in an integrated circuit 810 that is physically spaced apart from the sensors 110-1 and 110-2.

For example, the sensors 110-1 and 110-2 can be located adjacent to a disc brake assembly in an automobile, where significant temperatures can be present, while integrated circuit 810 that has the processing circuits 134-1 and 134-2 and multiplexor 810 can be located away from the disc brake where substantially lower temperatures are present.

There are many other reasons why it can be beneficial to locate integrated circuit 810 away from the sensors 110-1 and 110-2. Not being co-located eliminates the need for routing the power and ground wires. It may also make economic sense to integrate the coil (which is inexpensive) with an assembly, while keeping all electronics in one box at another location.

Position detecting system 800 is an example of a differential system where first sensor 110-1 generates a coarse response and second sensor 110-2 generates a fine response. A target can have an arbitrary sensing range by stretching the shape, i.e., elongating the shape. However, as the shape is stretched the resolution is reduced due to the limited dynamic range of the processing circuit.

This limitation is overcome by using the second inductor 112-2, and the second target 130-2, which is not a stretched shape, but a concatenation of multiple copies of the same shape, such as the end-to-end diamond shapes with concave sides shown in the FIG. 8 example. For this additional target, the direction of each consecutive shape is reserved.

Thus, the stretched target 130-1 is used to measure the coarse position, while the repetitive pattern target 130-2 is used to enhance the accuracy of the position measurement. For all of the shapes shown in FIGS. 4A-8, the negative image can be applied as well, where the shape becomes a slot of the same layout in a larger sheet of conductive material.

Position detecting system 800 operates the same as position detecting system 700, except that position detecting system 800 utilizes two targets 130-1 and 130-2 that have different shapes, and two processing circuits 134-1 and 134-2 to process the responses from the sensors 110-1 and 110-2.

Processing circuit 134-1, which is connected to sensor 110-1, receives a coarse response based on the coil characteristic from sensor 110-1, and determines a position of target 130-1 with respect to a position of the sensor 110-1 in response to the coarse response. Processing circuit 134-2, which is connected to sensor 110-2, receives a fine response based on the coil characteristic from sensor 110-2, and determines a position of target 130-2 with respect to a position of sensor 110-2 in response to the fine response.

Figure 9A:
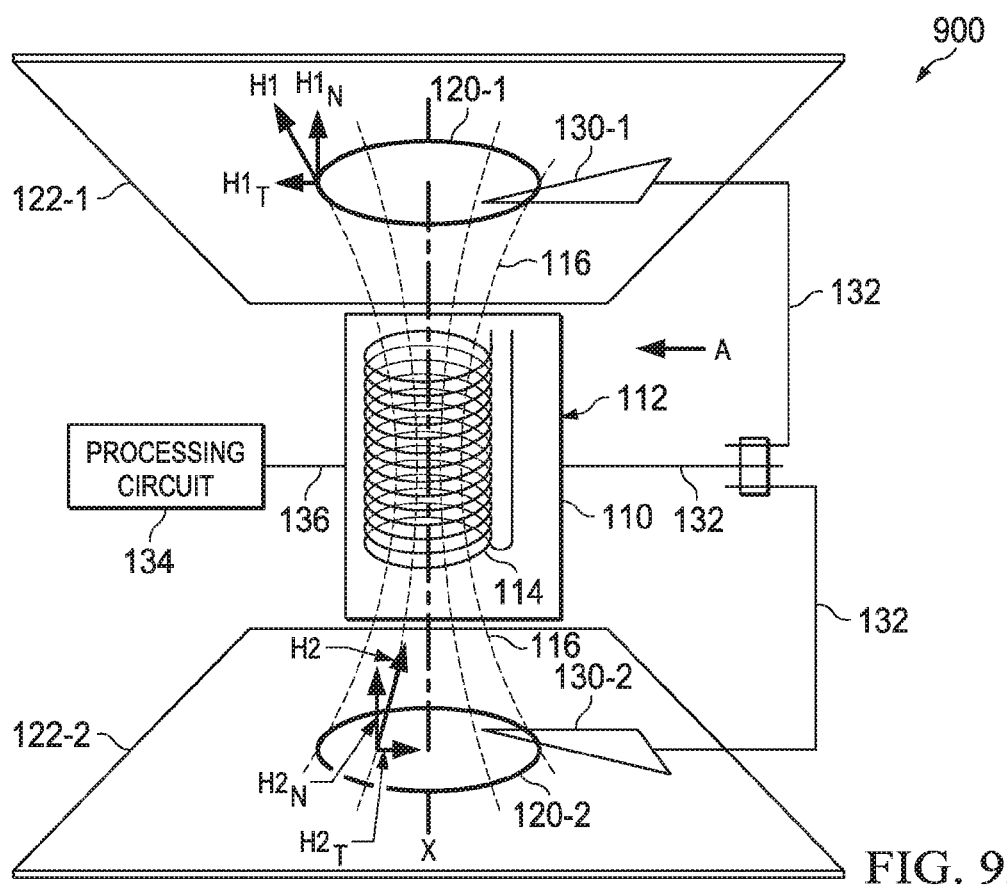
FIG. 9A is a diagram illustrating an example of a position detecting system 900 in accordance with an alternate embodiment of the present invention.

FIG. 9A shows a diagram that illustrates an example of a position detecting system 900 in accordance with an alternate embodiment of the present invention. Position detecting system 900 is the same as position detecting system 100, except that position detecting system 900 utilizes multiple targets 130 in lieu of a single target 130.

The FIG. 9A example illustrates two targets 130-1 and 130-2 which are implemented as right triangles that lie substantially in register with each other in parallel planes 122-1 and 122-2. The time varying magnetic field 116 has a number of first magnetic field vectors H1 that intersect a first sensing domain area 120-1 of a first plane 122-1, and a number of second magnetic field vectors H2 that intersect a second sensing domain area 120-2 of a second plane 122-2.

Magnetic field vector H1 has a normal component $H1_N$ that lies orthogonal to plane 122-1, and a tangent component $H1_T$ that lies parallel to plane 122-1. Further, a magnitude of the normal component $H1_N$ is substantially greater than a magnitude of the tangent component $H1_T$. In addition, the orientation of the normal component $H1_N$ is the same as the orientation of time varying magnetic field 116 at the intersection of the longitudinal axis X and plane 122-1.

Similarly, magnetic field vector H2 has a normal component $H2_N$ that lies orthogonal to plane 122-2, and a tangent component $H2_T$ that lies parallel to plane 122-2. Further, a magnitude of the normal component $H2_N$ is substantially greater than a magnitude of the tangent component $H2_T$. In addition, the orientation of the normal component $H2_N$ is the same as the orientation of time varying magnetic field 116 at the intersection of the longitudinal axis X and plane 122-2.

The first and second planes 122-1 and 122-2 are substantially orthogonal to the longitudinal axis X, with coil 114 lying between the first and second planes 122-1 and 122-2. In addition, target 130-1 moves within plane 122-1, while some portion of target 130-1 always lies within the sensing domain area 120-1. Similarly, target 130-2 moves within plane 122-2, while some portion of target 130-2 always lies within the sensing domain area 120-2. Further, the amount of target 130-1 that lies within the sensing domain area 120-1 changes as target 130-1 moves, and the amount of target 130-2 that lies within the sensing domain area 120-2 changes as target 130-2 moves. Further, support structure 132 is connected to the sensor 110 and the targets 130-1 and 130-2.

In operation, target 130-1 and target 130-2 are exposed to the time varying magnetic field 116 generated by coil 114. The magnetic flux from the time varying magnetic field induces eddy currents in targets 130-1 and 130-2, with the strongest eddy currents located in the portions of the target 130-1 that lie within the sensing domain area 120-1, and in the portions of the target 130-2 that lie within the sensing domain area 120-2.

As shown in FIG. 9A, the simultaneous movement of targets 130-1 and 130-2 in the direction of arrow A, such as when targets 130-1 and 130-2 are connected together, changes the amount of target 130-1 that lies within the sensing domain area 120-1, and the amount of target 130-2 that lies within the sensing domain area 120-2. (Although the present example illustrates simultaneous movement of targets 130-1 and 130-2, targets 130-1 and 130-2 can alternately be independently moved at the same or different rates. In addition, after moving in the direction of arrow A, the targets 130-1 and 130-2 can move in the opposite direction.) As a result, the movement changes the percentage of the total amount of magnetic flux generated by coil 114 that is received by the targets 130-1 and 130-2 which, in turn, changes the magnitudes of the eddy currents in the targets 130-1 and 130-2.

The changes in the percentages of magnetic flux received by the targets 130-1 and 130-2, and in the magnitudes of the eddy currents, cause the electrical characteristics (e.g., inductance and Q factor) of coil 114 to change. Thus, coil 114 has a coil characteristic that changes as the targets 130-1 and 130-2 move within the sensing domain areas 120-1 and 120-2 of plane 122. Processing circuit 134 then receives the coil characteristic from sensor 110, and determines the position of the targets 130-1 and 130-2 with respect to the position of sensor 110 in response to the coil characteristic.

Processing circuit 134 can be implemented as an integrated circuit that is physically spaced apart from sensor 110 and the targets 130-1 and 130-2. In other words, processing circuit 134 and sensor 110 are not co-located. For example, sensor 110 can be located adjacent to a disc brake assembly in an automobile, where significant temperatures can be present, while integrated processing circuit 134 can be located away from the disc brake where substantially lower temperatures are present.

There are many other reasons why it can be beneficial to locate processing circuit 134 away from sensor 110. Not being co-located eliminates the need for routing the power and ground wires. It may also make economic sense to integrate the coil (which is inexpensive) with an assembly, while keeping all electronics in one box at another location.

Figure 9B:
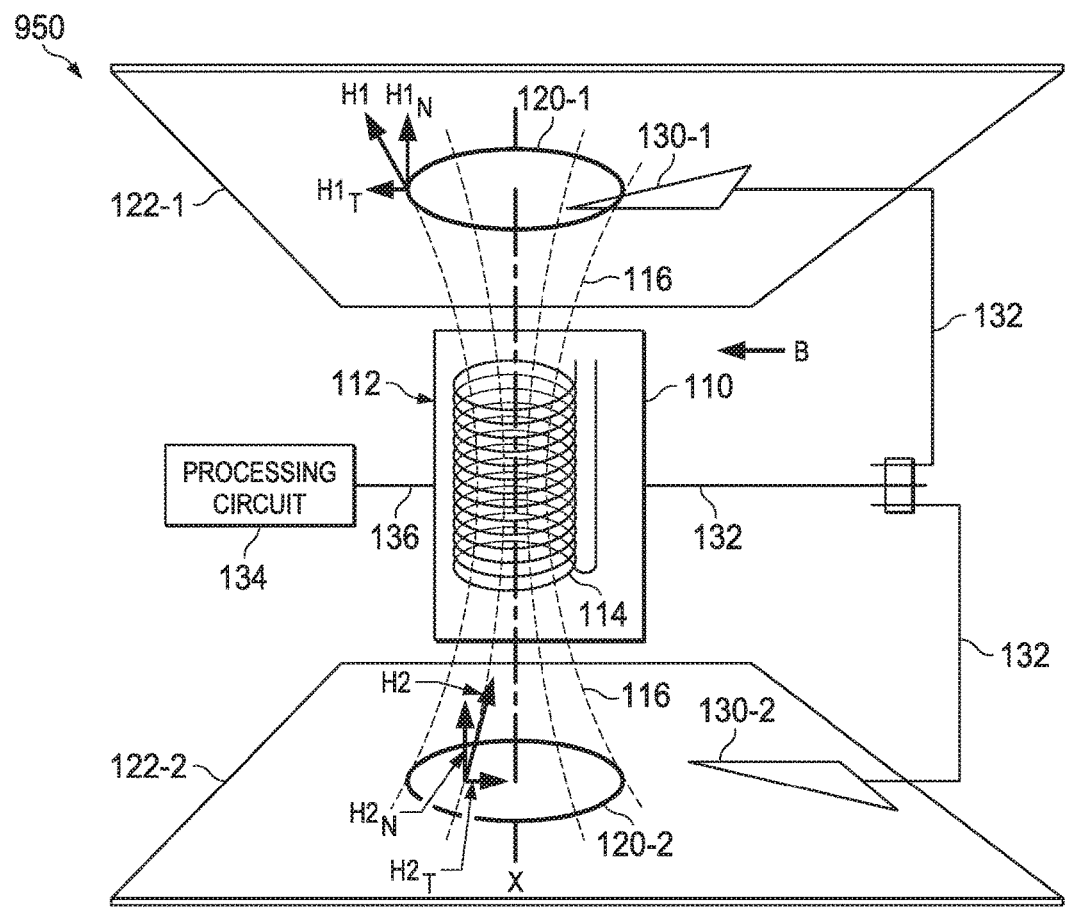
FIG. 9B is a diagram illustrating an example of a position detecting system 950 in accordance with an alternate embodiment of the present invention.

FIG. 9B shows a diagram that illustrates an example of a position detecting system 950 in accordance with an alternate embodiment of the present invention. Position detecting system 950 is the same as position detecting system 900, except that the targets 130-1 and 130-2 are staggered.

As shown in FIG. 9B, the simultaneous movement of targets 130-1 and 130-2 in the direction of arrow B causes some portion of target 130-1 to always lie within sensing domain area 120-1, or some portion of target 130-2 to always lie within sensing domain area 120-2. In other words, one of the targets 130-1 or 130-2 can leave a sensing domain area as long as the other target 130-1 or 130-2 remains in a sensing domain area. (After moving in the direction of arrow B, the targets 130-1 and 130-2 can move in the opposite direction.)

Figure 10A:
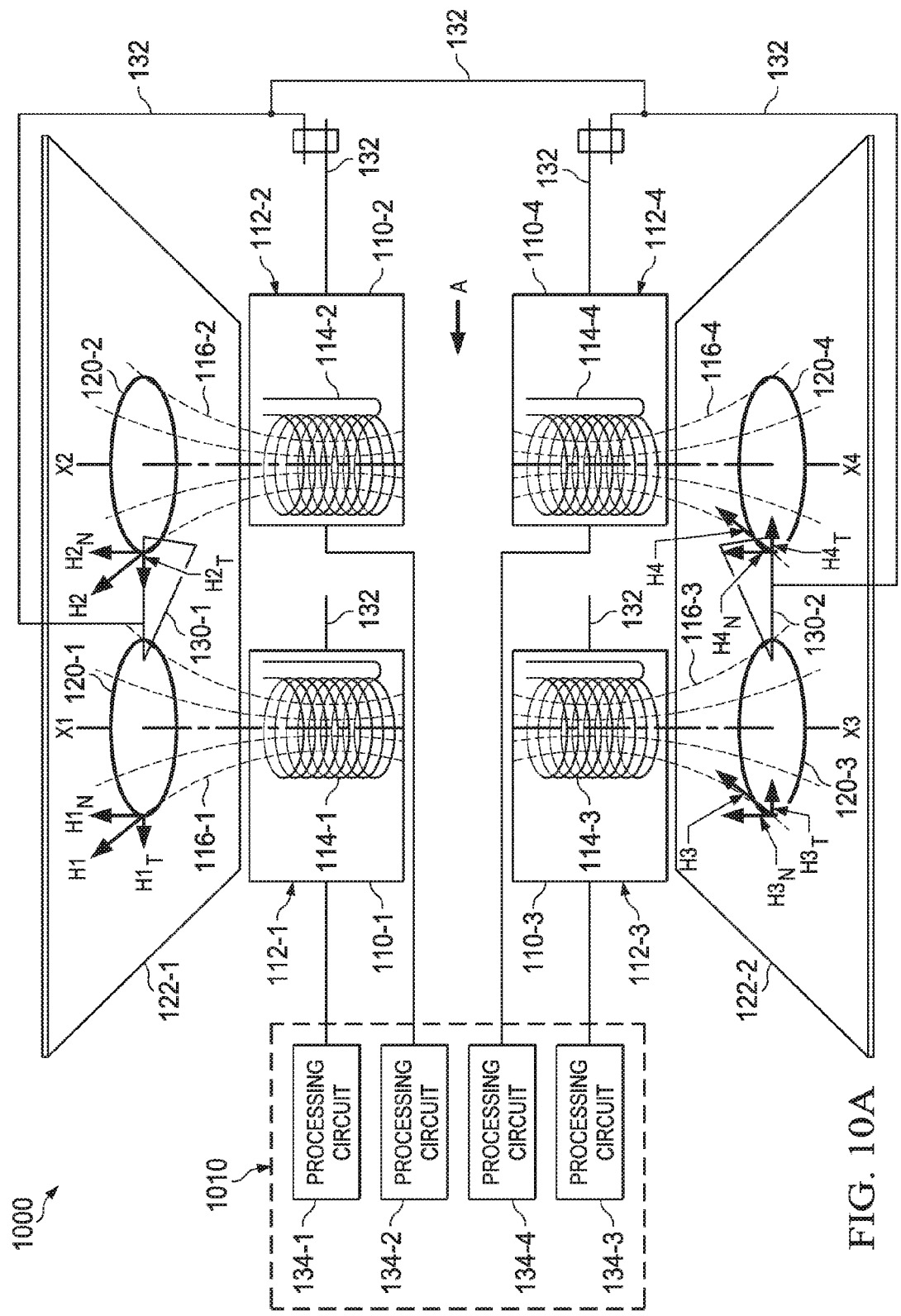
FIG. 10A is a diagram illustrating an example of a position detecting system 1000 in accordance with an alternate embodiment of the present invention.

FIG. 10A shows a diagram that illustrates an example of a position detecting system 1000 in accordance with an alternate embodiment of the present invention. Position detecting system 1000 is the same as position detecting system 100, except that position detecting system 1000 utilizes multiple targets 130 with multiple sensors 110 per target 130 in lieu of a single target 130 with a single sensor 110.

The FIG. 10A example illustrates two targets 130-1 and 130-2 which are implemented as right triangles that lie substantially in register with each other in parallel planes 122-1 and 122-2. The FIG. 10A example further illustrates four sensors 110-1, 110-2, 110-3, and 110-4 with four inductors 112-1, 112-2, 112-3, and 112-4. The four inductors 112-1, 112-2, 112-3, and 112-4 are implemented with four coils 114-1, 114-2, 114-3, and 114-4, which have four longitudinal axes X1, X2, X3, and X4. In addition, the four coils 114-1, 114-2, 114-3, and 114-4 generate four time varying magnetic fields 116-1, 116-2, 116-3, and 116-4.

As with sensor 110, the time varying magnetic field 116-1 has a number of magnetic field vectors H1 that intersect a sensing domain area 120-1 of plane 122-1, the time varying magnetic field 116-2 has a number of magnetic field vectors H2 that intersect a sensing domain area 120-2 of plane 122-1, the time varying magnetic field 116-3 has a number of magnetic field vectors H3 that intersect a sensing domain area 120-3 of plane 122-2, and the time varying magnetic field 116-4 has a number of magnetic field vectors H4 that intersect a sensing domain area 120-4 of plane 122-2.

The magnetic field vectors H1, H2, H3, and H4 have normal components $H1_N$, $H2_N$, $H3_N$, and $H4_N$, respectively, that lie orthogonal to the planes 122-1 and 122-2, and a tangent component $H1_T$, $H2_T$, $H3_T$, and $H4_T$, respectively, that lie parallel to plane 122-1 and 122-2. Further, a magnitude of the normal component $H1_N$, $H2_N$, $H3_N$, and $H4_N$ is substantially greater than a magnitude of the tangent component $H1_T$, $H2_T$, $H3_T$, and $H4_T$.

The orientation of the normal components $H1_N$ and $H2_N$ are the same as the orientation of time varying magnetic fields 116-1 and 116-2, respectively, at the intersections of the longitudinal axes X1 and X2, respectively, and plane 122-1. Similarly, the orientation of the normal components $H3_N$ and $H4_N$ are the same as the orientation of time varying magnetic fields 116-3 and 116-4, respectively, at the intersections of the longitudinal axes X3 and X4, respectively, and plane 122-2. In addition, the first and second planes 122-1 and 122-2 are substantially orthogonal to the longitudinal axes X1, X2, X3, and X4.

Further, target 130-1 moves within plane 122-1, while some portion of target 130-1 always lies within the sensing domain area 120-1 or 120-2. Similarly, target 130-2 moves within plane 122-2, while some portion of target 130-2 always lies within the sensing domain area 120-3 or 120-4. Further, the amount of target 130-1 that lies within the sensing domain areas 120-1 and 120-2 changes as target 130-1 moves, and the amount of target 130-2 that lies within the sensing domain area 120-3 and 120-4 changes as target 130-2 moves.

In addition, the planes 122-1 and 122-2 are substantially orthogonal to the axes X1, X2, X3, and X4. Further, support structure 132 is connected to the sensors 110-1, 110-2, 110-3, and 110-4 and the targets 130-1 and 130-2. Position detecting system 1000 also utilizes multiple processing circuits 134 in lieu of a single processing circuit. The FIG. 10A example illustrates four processing circuits 134-1, 134-2, 134-3, and 134-4 which are connected to the four sensors 110-1, 110-2, 110-3, and 110-4, respectively.

The processing circuits 134-1, 134-2, 134-3, and 134-4 can be formed in an integrated circuit 1010 that is physically spaced apart from the sensors 110-1, 110-2, 110-3, and 110-4. In other words, integrated circuit 1010 and the sensors 110-1, 110-2, 110-3, and 110-4 are not co-located. For example, the sensors 110-1, 110-2, 110-3, and 110-4 can be located adjacent to a disc brake assembly in an automobile, where significant temperatures can be present, while integrated circuit 1010 that has the processing circuits 134-1, 134-2, 134-3, and 134-4 can be located away from the disc brake where substantially lower temperatures are present.

There are many other reasons why it can be beneficial to locate integrated circuit 1010 away from the sensors 110-1, 110-2, 110-3, and 110-4. Not being co-located eliminates the need for routing the power and ground wires. It may also make economic sense to integrate the coil (which is inexpensive) with an assembly, while keeping all electronics in one box at another location.

In operation, target 130-1 is exposed to the time varying magnetic fields 116-1 and 116-2 generated by the coils 114-1 and 114-2. The magnetic flux from the time varying magnetic fields 116-1 and 116-2 induces eddy current in target 130-1, with the strongest eddy currents located in the portions of the target 130-1 that lie within the sensing domain areas 120-1 and 120-2.

Similarly, target 130-2 is exposed to the time varying magnetic fields 116-3 and 116-4 generated by the coils 114-3 and 114-4. The magnetic flux from the time varying magnetic fields 116-3 and 116-4 induces eddy current in target 130-2, with the strongest eddy currents located in the portions of the target 130-2 that lie within the sensing domain areas 120-3 and 120-4.

As shown in FIG. 10A, the simultaneous movement of targets 130-1 and 130-2 in the direction of arrow A, such as when targets 130-1 and 130-2 are connected together, changes the amount of target 130-1 that lies within the sensing domain areas 120-1 and 120-2, and the amount of target 130-2 that lies within the sensing domain area 120-3 and 120-4. (Although the present example illustrates simultaneous movement of targets 130-1 and 130-2, targets 130-1 and 130-2 can alternately be independently moved at the same or different rates. In addition, after moving in the direction of arrow A, the targets 130-1 and 130-2 can move in the opposite direction.)

As a result, the movement changes the percentage of the total amount of magnetic flux generated by the coils 114-1, 114-2, 114-3, and 114-4 that is received by the targets 130-1 and 130-2 which, in turn, changes the magnitudes of the eddy currents in the targets 130-1 and 130-2.

The changes in the percentages of magnetic flux received by the targets 130-1 and 130-2, and in the magnitudes of the eddy currents, cause the electrical characteristics (e.g., inductance and Q factor) of the coils 114-1, 114-2, 114-3, and 114-4 to change. Thus, the first and second coils 114-1 and 114-2 have first and second coil characteristics that change as target 130-1 moves within the sensing domain areas 120-1 and 120-2 of plane 122-1, while the third and fourth coils 114-3 and 114-4 have third and fourth coil characteristics that change as target 130-2 moves within the sensing domain areas 120-3 and 120-4 of plane 122-2.

Processing circuit 134-1 receives the coil characteristic from sensor 110-1, and determines a position of target 130-1 with respect to the position of sensor 110-1 in response to the coil characteristic of coil 114-1. Processing circuit 134-2 receives the coil characteristic from sensor 110-2, and determines a position of target 130-1 with respect to the position of sensor 110-2 in response to the coil characteristic of coil 114-2.

Processing circuit 134-3 receives the coil characteristic from sensor 110-3, and determines a position of target 130-2 with respect to the position of sensor 110-3 in response to the coil characteristic of coil 114-3. Processing circuit 134-4 receives the coil characteristic from sensor 110-4, and determines a position of target 130-2 with respect to the position of sensor 110-4 in response to the coil characteristic of coil 114-4.

Figure 10B:
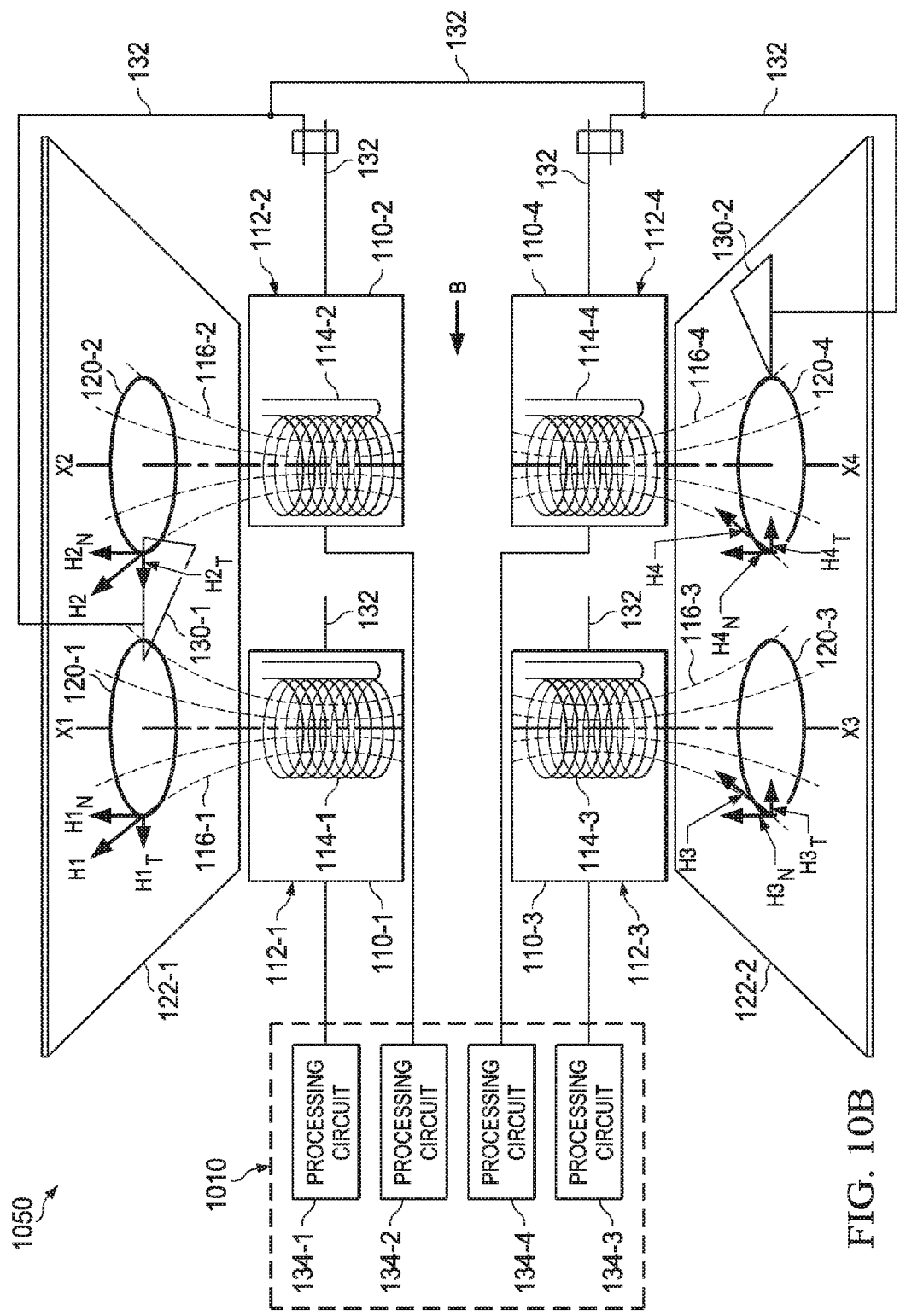
FIG. 10B is a diagram illustrating an example of a position detecting system 1050 in accordance with an alternate embodiment of the present invention.

FIG. 10B shows a diagram that illustrates an example of a position detecting system 1050 in accordance with an alternate embodiment of the present invention. Position detecting system 1050 is the same as position detecting system 1000, except that targets 130-1 and 130-2 are staggered.

As shown in FIG. 10B, the simultaneous movement of targets 130-1 and 130-2 in the direction of arrow B causes some portion of target 130-1 to always lie within sensing domain area 120-1 or sensing domain 120-2, or some portion of target 130-2 to always lie within sensing domain area 120-3 or sensing domain area 120-4. In other words, one of the targets 130-1 or 130-2 can leave a sensing domain area as long as the other target 130-1 or 130-2 remains in a sensing domain area. (After moving in the direction of arrow B, the targets 130-1 and 130-2 can move in the opposite direction.)

Figure 11:
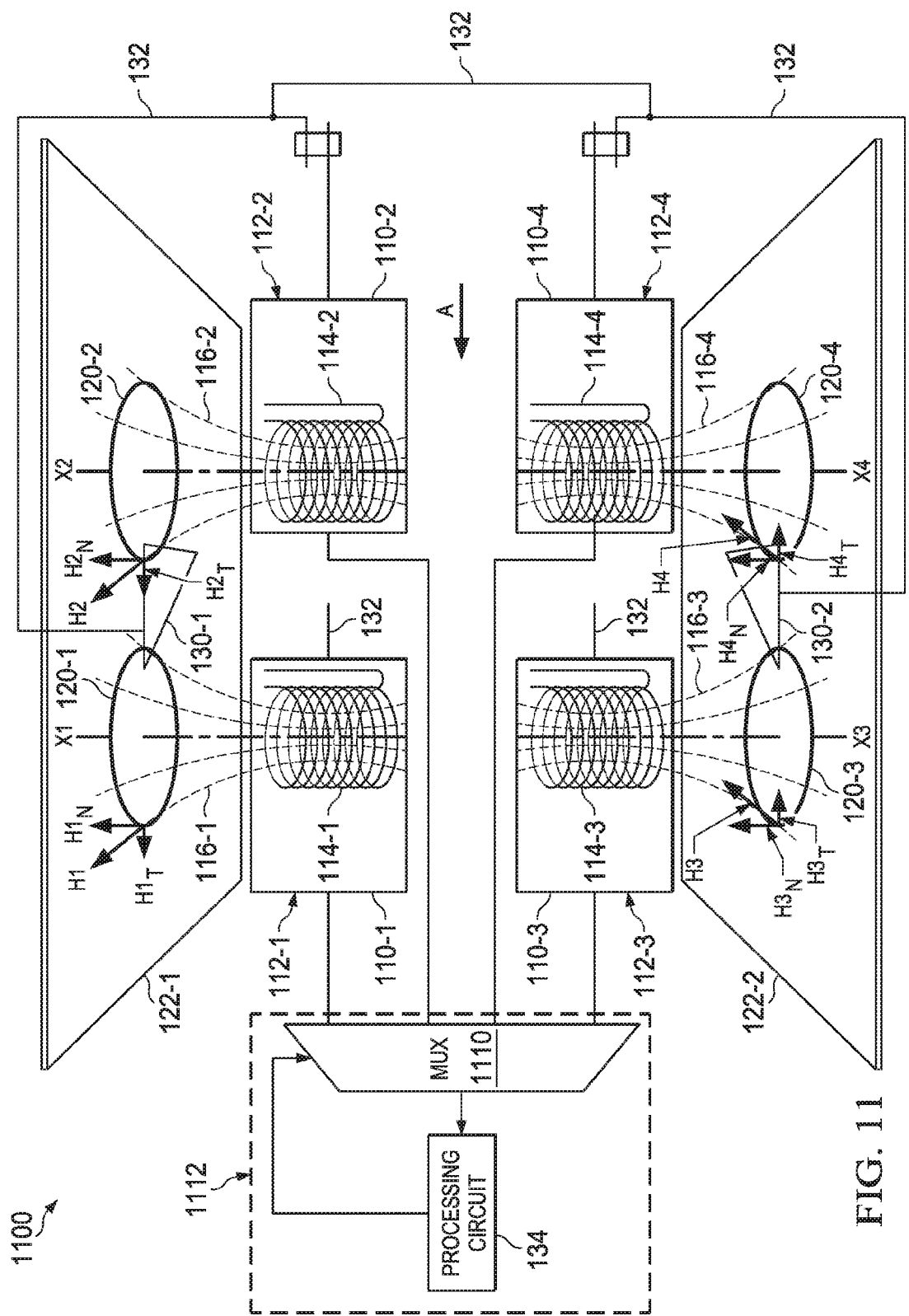
FIG. 11 is a diagram illustrating an example of a position detecting system 1100 in accordance with an alternate embodiment of the present invention.

FIG. 11 shows a diagram that illustrates an example of a position detecting system 1100 in accordance with an alternate embodiment of the present invention. Position detecting system 1100 is the same as position detecting system 1000, except that position detecting system 1100 utilizes a multiplexor 1110 and a single processing circuit 134 in lieu of the four processing circuits 134-1, 134-2, 134-3, and 134-4 shown in FIG. 10A. (Position detecting system 1100 can also be the same as position detecting system 1050, except that position detecting system 1100 utilizes multiplexor 1110 and single processing circuit 134 in lieu of the four processing circuits 134-1, 134-2, 134-3, and 134-4 shown in FIG. 10B.)

Multiplexor 1110 and processing circuit 134 can be formed in an integrated circuit 1112 that is physically spaced apart from the sensors 110-1, 110-2, 110-3, and 110-4. For example, the sensors 110-1, 110-2, 110-3, and 110-4 can be located adjacent to a disc brake assembly in an automobile, where significant temperatures can be present, while integrated circuit 1112 that has processing circuit 134 and multiplexor 1110 can be located away from the disc brake where substantially lower temperatures are present.

There are many other reasons why it can be beneficial to locate integrated circuit 1112 away from the sensors 110-1, 110-2, 110-3, and 110-4. Not being co-located eliminates the need for routing the power and ground wires. It may also make economic sense to integrate the coil (which is inexpensive) with an assembly, while keeping all electronics in one box at another location.

In operation, multiplexor 1110 selectively passes the changed coil characteristics from the sensors 110-1, 110-2, 110-3, and 110-4 to processing circuit 134 under the control of processing circuit 134. Processing circuit 134 then determines the position of target 130-1 with respect to the position of the first and second sensors 110-1 and 110-2 in response to the first and second coil characteristics, and the position of target 130-2 with respect to the position of the third and fourth sensors 110-3 and 110-4 in response to the third and fourth coil characteristics.

A single-target single-sensor system cannot distinguish the differences between movement in the axial or longitudinal direction. However, by utilizing two sensors, such as in FIGS. 7, 8, and 10, the responses from the multiple sensors can be utilized to solve movement in axial or longitudinal direction, while canceling the response of the sensors to movement in the longitudinal or axial direction, respectively.

One advantage of the position detecting systems is that since the response of a sensor 110 depends on the amount of a target 130 that lies within a sensing domain area 120, the response of sensor 120 to position is controlled by the shape of target 110. Therefore, a shape can be chosen that optimizes the dynamic range in any application.

An additional advantage of the position detecting systems is that the sensing range is independent of the diameter of coil 114. In the prior art case of axial sensing (where only the longitudinal distance between the target and the coil increases or decreases), the range is limited to approximately 50% of the coil diameter. However, in the present invention, lateral sensing enables position sensing over an arbitrary distance. In addition, the position detecting systems enable sensing range extension without losing resolution. Because the target shape can be chosen arbitrarily, it enables range extension by using a coarse/fine approach, such that high resolution is maintained.

A further advantage of the position detecting systems is that when multiple sensors are used, the multiple sensors enable position sensing in multidimensional space, where each sensor adds one dimension. This, in turn, enables the elimination of position tolerances in one or more spatial dimensions, where each additional sensor enables the elimination of one dimension. The use of multiple sensors also enables the elimination of temperature drift. Temperature drift can be eliminated by creating a differential setup and a ratiometric setup, and by using a reference sensor and a reference target. Temperature drift can also be eliminated by using multiple sensors with different shaped targets.

Another advantage of the position detecting systems is that because planar shapes can be applied, inexpensive printed circuit board (PCB) manufacturing techniques can be applied to build targets that allow position sensing in any planar direction, including circular and linear. There is no need for complex mechanical assemblies as in the prior art case of axial sensing.

Further, multiple sensors 110 can be applied to detect the position of target 130. In addition, because inexpensive PCB manufacturing techniques can be applied, multiple mechanically coupled targets 130 can be applied. This enables elimination of measurement errors due to mechanical tolerances in multiple directions that are orthogonal to the motion that is being detected.

The preceding description of certain example embodiments and applications, and generally associated methods, illustrate the principles and features of the claimed invention. Other embodiments and applications, and various design choices, will be apparent to those skilled in the art from the description, figures and claims of this specification. Accordingly, the preceding description does not define or limit the scope of the invention, which is defined by the following claims.

What is claimed is:

1. A position detecting system comprising:
a first sensing plane;
a first differential sensor having a first coil with a first longitudinal axis substantially orthogonal to the first sensing plane, the first coil to generate a first time varying magnetic field with a plurality of first magnetic field vectors that intersect a first sensing domain area of the first sensing plane, each first magnetic field vector that intersects the first sensing domain area having a normal component that lies orthogonal to the first sensing plane and a tangent component that lies parallel to the first sensing plane, a magnitude of the normal component being substantially greater than a magnitude of the tangent component, an orientation of the normal component matching an orientation of the first time varying magnetic field at an intersection of the first longitudinal axis and the first sensing plane;
a second differential sensor having a second coil with a second longitudinal axis substantially orthogonal to the first sensing plane, the second coil to generate a second time varying magnetic field with a plurality of second magnetic field vectors that intersect a second sensing domain area of the first sensing plane, each second magnetic field vector that intersects the first sensing domain area having a normal component that lies orthogonal to the first sensing plane and a tangent component that lies parallel to the first sensing plane, a magnitude of the normal component being substantially greater than a magnitude of the tangent component, an orientation of the normal component matching an orientation of the second time varying magnetic field at an intersection of the second longitudinal axis and the first sensing plane;
a first target being movable within the first sensing plane, some portion of the first target always lying within the first sensing domain area of the first sensing plane; and
a second target being movable within the first sensing plane, some portion of the second target always lying within the second sensing domain area of the first sensing plane;

the first and second targets configured to move simultaneously through respectively the first and second sensing domain areas;

processing circuitry coupled to the first and second differential sensors, the processing circuit controlling the first and second differential sensors to determine a differential response of the first and second differential sensor to the first and second targets;

a support structure connected to the first sensor, the second sensor, the first target and the second target.

2. The system of claim 1, wherein
the first target is configured with a first shape; and
the second target configured with a second shape that is a reverse inverted orientation of the first shape;
the respective responses of the first and second differential sensors to the simultaneous movement of respectively the first and second targets being differentially inverse.

3. The system of claim 2, wherein the first and second targets are configured as right triangles, and oriented with facing hypotenuses.

4. The system of claim 1, wherein the first and second targets are configured with respectively coarse and fine shapes to provide respectively coarse and fine responses of the first and second differential sensors to the simultaneous movement of respectively the first and second targets.

5. The system of claim 4, wherein
the first target is configured with a first shape to provide a coarse response to movement of the first target along the first shape; and
the second target is configured with a concatenation of multiple copies of a second shape to provide a fine response to movement of the second target from one concatenated second shape to a next concatenated second shape.

6. The system of claim 1, wherein the processing circuitry is one of:
a multiplexer coupled to the first and second differential sensors, and a processor coupled to the multiplexer; or
first and second processors coupled respectively to the first and second differential sensors.

7. The system of claim 1, wherein at least one of the first and second targets is a negative shape configured as a slot in a sheet of conductive material.

8. A position detecting system comprising:
first and second sensing planes with a substantially parallel orientation;
a differential sensor having a first coil disposed between the first and second sensing planes, the first coil having a first longitudinal axis substantially orthogonal to the first and second sensing planes, the first coil to generate a first time varying magnetic field with a plurality of first magnetic field vectors that intersect a first sensing domain area of the first sensing plane, and a plurality of second magnetic field vectors that intersect a second sensing domain area of the second sensing plane, opposite the first sensing domain area of the first sensing plane, each of the first and second magnetic field vectors having a normal component that lies orthogonal to the respective sensing plane and a tangent component that lies parallel to the respective sensing plane, a magnitude of the normal component being substantially greater than a magnitude of the tangent component, an orientation of the normal component matching an orientation of the respective time varying magnetic field at an intersection of the first longitudinal axis and the oppositely disposed first and second sensing planes;

a first target being movable within the first sensing plane, some portion of the first target always lying within the first sensing domain area of the first sensing plane; and
a second target being movable within the second sensing plane, some portion of the second target always lying within the second sensing domain area of the second sensing plane;
the first and second targets configured to move simultaneously through respectively the first and second sensing domain areas;
processing circuitry coupled to the differential sensors, the processing circuit controlling the differential sensor to determine a differential response of the differential sensor to the first and second targets;
a support structure connected to the first sensor, the second sensor, the first target and the second target.

9. The system of claim 8, wherein the first and second targets are configured with substantially identical shapes to provide the differential response of the differential sensor to the substantially simultaneous movement of the first and second targets within respective first and second sensing domain areas.

10. The system of claim 8, wherein at least one of the first and second targets is a negative shape configured as a slot in a sheet of conductive material.

11. A position detecting system comprising:
at least one sensing plane;
a differential sensor having at least a first coil with an associated longitudinal axis substantially orthogonal to the at least one sensing plane;
the differential sensor to generate at least one time varying magnetic field that creates at least first and second sensing domain areas of the at least one sensing plane;
each of the first and second sensing domain areas defined by magnetic field vectors having a normal component that lies orthogonal to the respective sensing plane and a tangent component that lies parallel to the respective sensing plane, a magnitude of the normal component being substantially greater than a magnitude of the tangent component, an orientation of the normal component matching an orientation of the respective time varying magnetic field at an intersection of the associated longitudinal axis and the at least one sensing plane;
a first target being movable within the at least one sensing plane, some portion of the first target always lying within the first sensing domain area; and
second target being movable within the at least one sensing plane, some portion of the second target always lying within the second sensing domain area;
the first and second targets configured to move simultaneously through respectively the first and second sensing domain areas;
processing circuitry coupled to the differential sensor, the processing circuit controlling the differential sensor to determine a differential response to the first and second targets;
a support structure connected to the differential sensor, the first target and the second target.

12. The system of claim 11, wherein:
the differential sensor comprises first and second coils with respective first and second longitudinal axes substantially orthogonal to the at least one sensing plane; and the first and second coils to generate respective first and second time varying magnetic fields that respectively create the first and second sensing domain areas of the at least one sensing plane.

13. The system of claim 12, wherein
the first target is configured with a first shape; and
the second target configured with a second shape that is a reverse inverted orientation of the first shape;
the respective responses of the first and second differential sensors to the simultaneous movement of respectively the first and second targets being differentially inverse.

14. The system of claim 13, wherein the first and second targets are configured as right triangles, and oriented with facing hypotenuses.

15. The system of claim 12, wherein the processing circuitry is one of:
a multiplexer coupled to the first and second coils, and a processor coupled to the multiplexer; or
first and second processors coupled respectively to the first and second coils.

16. The system of claim 11, wherein the first and second targets are configured with respectively coarse and fine shapes to provide respectively coarse and fine responses of the first and second differential sensors to the simultaneous movement of respectively the first and second targets.

17. The system of claim 16, wherein
the first target is configured with a first shape to provide a coarse response to movement of the first target along the first shape; and
the second target is configured with a concatenation of multiple copies of a second shape to provide a fine response to movement of the second target from one concatenated second shape to a next concatenated second shape.

18. The system of claim 11, comprising
first and second sensing planes with a substantially parallel orientation;
the differential sensor having a first coil disposed between the first and second sensing planes, with an associated longitudinal axis substantially orthogonal to the first and second sensing planes;
the differential sensor to generate with the first coil the at least one time varying magnetic field to create first and second oppositely disposed sensing domain areas of respectively the first and second sensing planes;
the first target being movable within the first sensing plane, some portion of the first target always lying within the first sensing domain area; and
the second target being movable within the second sensing plane, some portion of the second target always lying within the second sensing domain area.

19. The system of claim 18, wherein the first and second targets are configured with substantially identical shapes to provide the differential response of the differential sensor to the substantially simultaneous movement of the first and second targets within respective first and second sensing domain areas.

20. The system of claim 11, wherein at least one of the first and second targets is a negative shape configured as a slot in a sheet of conductive material.

\* \* \* \* \*